(12) United States Patent
 DiRubio et al.

(10) Patent No.: US 12,593,516 B2
(45) Date of Patent: Mar. 31, 2026

(54) PHOTOVOLTAIC DEVICES AND METHODS OF MAKING

(71) Applicant: First Solar, Inc., Tempe, AZ (US)

(72) Inventors: Christopher DiRubio, Perrysburg, OH (US); Markus Gloeckler, Perrysburg, OH (US); Weixin Li, Waterville, OH (US); Richard Malik, Jr., Rossford, OH (US); Riley Maxwell, Toledo, OH (US); Jason Sharrer, Millbury, OH (US); Jigish Trivedi, Perrysburg, OH (US)

(73) Assignee: First Solar, Inc., Phoenix, AZ (US)

( * ) Notice: Subject to any disclaimer, the term of this patent is extended or adjusted under 35 U.S.C. 154(b) by 596 days.

(21) Appl. No.: 17/771,748

(22) PCT Filed: Oct. 23, 2020

(86) PCT No.: PCT/US2020/057077
 § 371 (c)(1),
 (2) Date: Apr. 25, 2022

(87) PCT Pub. No.: WO2021/081334
 PCT Pub. Date: Apr. 29, 2021

(65) Prior Publication Data
 US 2022/0384668 A1 Dec. 1, 2022

Related U.S. Application Data

(60) Provisional application No. 62/925,986, filed on Oct. 25, 2019.

(51) Int. Cl.
 *H10F 19/90* (2025.01)
 *H10F 19/80* (2025.01)
 *H10F 77/00* (2025.01)

(52) U.S. Cl.
 CPC ........... *H10F 19/904* (2025.01); *H10F 19/80* (2025.01); *H10F 77/937* (2025.01)

(58) Field of Classification Search
 None
 See application file for complete search history.

(56) References Cited

U.S. PATENT DOCUMENTS

2011/0083734 A1 4/2011 Buller et al.
2012/0017980 A1 1/2012 Lai
 (Continued)

FOREIGN PATENT DOCUMENTS

CN 108649087 A * 10/2018 ............. H02S 20/25
JP 200068542 A 3/2000
 (Continued)

OTHER PUBLICATIONS

Japanese Notification of Reason(s) for Rejection, Application No. 2023-181561, dated Nov. 5, 2024.
 (Continued)

*Primary Examiner* — Dustin Q Dam
(74) *Attorney, Agent, or Firm* — MacMillan, Sobanski & Todd, LLC

(57) ABSTRACT

Photovoltaic devices, and methods of making the same, are described. A photovoltaic device comprises a plurality of electrically connected photovoltaic cells, wherein the photovoltaic cells comprise a conducting layer having a first surface and a second surface, the first surface facing an absorber layer; an insulating material disposed on the second surface over at least one of the photovoltaic cells; a conductive member on the insulating material, wherein the insulating material is configured to electrically insulate the conductive member from the second surface; a bus member electrically coupled to the one of the plurality of photovoltaic cells and to the conductive member; and an edge seal (Continued)

comprising a sealant material extending over at least a portion of the one of the plurality of photovoltaic cells; wherein the bus member is disposed between the edge seal and the plurality of photovoltaic cells.

10 Claims, 21 Drawing Sheets

(56) References Cited

U.S. PATENT DOCUMENTS

| | | |
|---|---|---|
| 2012/0048334 A1 | 3/2012 | Cohen et al. |
| 2012/0090680 A1 | 4/2012 | Yagiura et al. |
| 2012/0118357 A1 | 5/2012 | Hong |
| 2013/0068279 A1 | 3/2013 | Buller et al. |
| 2014/0102537 A1* | 4/2014 | Malik, Jr. ............. H10F 77/935 |
| | | 156/60 |
| 2014/0124034 A1 | 5/2014 | Nishimoto et al. |
| 2015/0200315 A1 | 7/2015 | Mukai |

FOREIGN PATENT DOCUMENTS

| | | |
|---|---|---|
| JP | 2011199242 A | 10/2011 |
| JP | 2013008922 A | 1/2013 |
| JP | 2013219066 A | 10/2013 |
| WO | 2010150675 A1 | 12/2010 |

OTHER PUBLICATIONS

The Extended European Search Report, Application No. 23178663. 3, dated Nov. 17, 2023.
Japanese Notification of Reasons for Rejection, Japanese Application No. 2022-524146, dated Oct. 18, 2022.
International Search Report and Written Opinion, Application No. PCT/US2020/057077, dated Mar. 25, 2021.
Intellectual Property India, Examination report under sections 12 & 13 of Patents Act, 1970 and Patents Rules, 2003, dated Dec. 29, 2023, Application No. 202217023364.
European extended search report, mailed Dec. 2, 2025, Application No. 25179966.4.

* cited by examiner

100

358     301     334

200a

200b

200c

200d

226

234

100

358     301     332     334

200a

200b

200c

200d

226

234

PHOTOVOLTAIC DEVICES AND METHODS OF MAKING

BACKGROUND

A photovoltaic device generates electrical power by converting light into electricity using semiconductor materials that exhibit the photovoltaic effect. Photovoltaic devices include a number of layers divided into a plurality of photovoltaic cells. Each photovoltaic cell can convert a light source, such as sunlight, into electrical power and can be connected in series with one or more adjacent cells. Accordingly, current generated by adjacent cells can flow through each of the photovoltaic cells.

Improving contact between current collection portions of the photovoltaic device is important for efficient and durable operation of the device. For example, the electrical junction between the conductive member and bus member is a current collection contact that is important for maintaining function of the photovoltaic device. If the junction is compromised or fails, an open circuit can be created and the photovoltaic device will be rendered inoperable. Accordingly, there exists an ongoing need in the industry for an improved, more robust, and more reliable electrical contact between the conductive member and bus member that can increase the performance of photovoltaic devices.

DETAILED DESCRIPTION

Photovoltaic devices can be formed by deposition of various semiconductor materials and electrode layers as thin (generally recognized in the art as less than 10 microns) film layers on a glass substrate. The substrate can then undergo various processing steps, including laser scribing processes, to define and isolate individual photovoltaic cells, define a perimeter edge zone around the photovoltaic cells, and to connect the photovoltaic cells in series. These steps can result in generation of a plurality of individual photovoltaic cells defined within the physical edges of the substrate.

One method for collecting the current from a photovoltaic device is to attach an insulating material (e.g., an insulating tape) lengthwise along the device across the photovoltaic cells. A conductive member (e.g., a conductive foil tape or ribbon) can then be aligned and attached to the insulating material. A bus member (e.g., a bus bar in the form of an adhesive bus tape) can then be attached at opposite longitudinal ends of the device, aligned with the first and last cells, respectively. The bus member can cross over and attach to the conductive member, collect the current from the cells, and transfer the current to the conductive member. The conductive member can be separated in a junction box where leads are connected to separated ends of the conductive member. The leads can provide a means to connect the photovoltaic device to a load, other cells, a grid, and so forth.

The present technology improves reliability and durability of current collecting portions of photovoltaic devices to improve performance of photovoltaic devices. For example, the current from a photovoltaic device can be collected by attaching an insulating material (e.g., an insulating tape) lengthwise along the device across the photovoltaic cells and aligning and attaching a conductive member (e.g., a conductive foil tape or ribbon) to the insulating material. A bus member (e.g., a bus bar in the form of an adhesive bus tape) can then be attached at opposite longitudinal ends of the photovoltaic device, aligned with the first and last cells of the photovoltaic device, respectively. In certain configurations, the bus member can cross over and attach to the conductive member, collect the current from the cells, and transfer the current to the conductive member. Where the bus member crosses over near an end of the conductive member, the connection can be described as a T-shaped junction or a T-joint. The T-joint is where the current from the photovoltaic device can accumulate, thus a low and stable contact resistance at that location can be important to maintain good device performance. However, it is possible that during various manufacturing steps, a bus member may be physically displaced by the forces involved in manufacturing, and so it is advantageous to protect the bus member during manufacturing.

Figure 1:
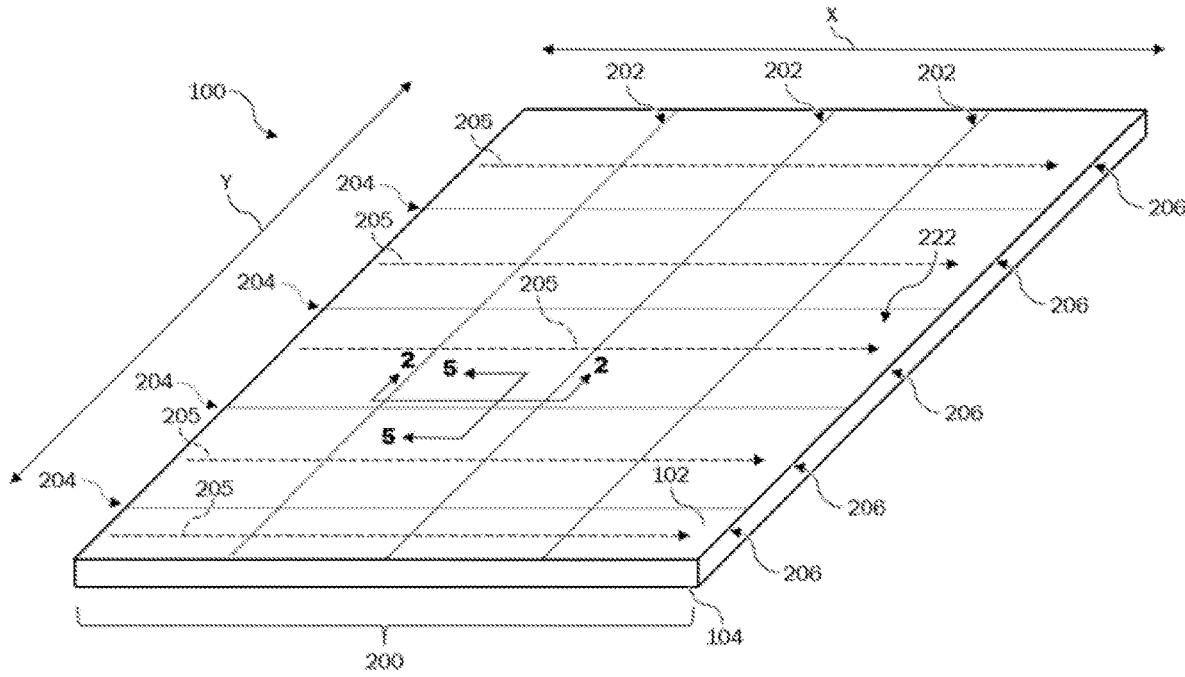
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the energy side 102 and the opposing side 104. As used herein, the term "layer" refers to a thickness of material provided upon a surface. Each layer can cover all or any portion of the surface. In some embodiments, the layers of the photovoltaic device 100 can be divided into an array of photovoltaic cells 200. For example, the photovoltaic device 100 can be scribed according to a plurality of serial scribes 202 and a plurality of parallel scribes 204. The serial scribes 202 can extend along a length Y of the photovoltaic device 100 and demarcate the photovoltaic cells 200 along the length Y of the photovoltaic device 100. The serial scribes 202 can be configured to connect neighboring cells of the photovoltaic cells 200 serially along a width X of the photovoltaic device 100. Serial scribes 202 can form a monolithic interconnect of the neighboring cells, i.e., adjacent to the serial scribe 202. The parallel scribes 204 can extend along the width X of the photovoltaic device 100 and demarcate the photovoltaic cells 200 along the width X of the photovoltaic device 100. Under operations, current 205 can predominantly flow along the width X through the photovoltaic cells 200 serially connected by the serial scribes 202. Under operations, parallel scribes 204 can limit the ability of current 205 to flow along the length Y. Parallel scribes 204 are optional and can be configured to separate the photovoltaic cells 200 that are connected serially into groups 206 arranged along length Y. Accordingly, the serial scribes 202 and the parallel scribes 204 can demarcate the array of the photovoltaic cells 200.

Referring still to FIG. 1, the parallel scribes 204 can electrically isolate the groups 206 of photovoltaic cells 200 that are connected serially. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA) such as, for example, less than or equal to about 100 mA in one embodiment, less than or equal to about 75 mA in another embodiment, or less than or equal to about 50 mA in a further embodiment.

Figures 2, 3:
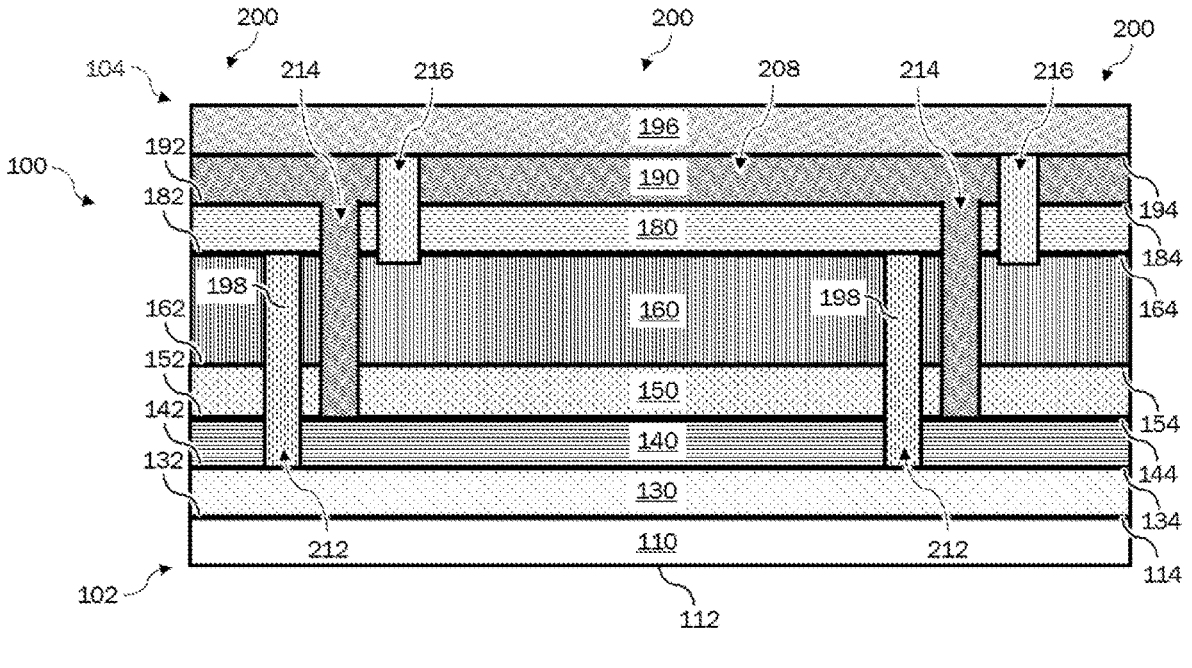
FIG. 2 schematically depicts a cross-sectional view along 2-2 of the photovoltaic device of FIG. 1 according to one or more embodiments shown and described herein.
FIG. 3 schematically depicts a substrate according to one or more embodiments shown and described herein.

Referring collectively to FIGS. 1 and 2, the layers of the photovoltaic device 100 can include a substrate 110 configured to facilitate the transmission of light into the photovoltaic device 100. The substrate 110 can be disposed at the energy side 102 of the photovoltaic device 100. Referring now to FIGS. 2 and 3, the substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 900% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 2, the photovoltaic device 100 can include a barrier layer 130 configured to mitigate diffusion of contaminants (e.g., sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 140 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising cadmium, tellurium, selenium, or any combination thereof. Suitable examples include, but are not limited to, ternaries of cadmium, selenium and tellurium (e.g., $CdSe_xTe_{1-x}$), or a compound comprising cadmium, selenium, tellurium, and one or more additional element. The absorber layer 160 may further comprise one or more dopants. Photovoltaic devices may include a plurality of absorber materials.

In embodiments where the absorber layer 160 comprises tellurium and cadmium, the atomic percent of the tellurium can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, the atomic percent of the tellurium in the absorber layer 160 can be greater than about 45 atomic percent such as, for example, greater than about 49% in one embodiment. It is noted that the atomic percent described herein is representative of the entirety of the absorber layer 160, the atomic percentage of material at a particular location within the absorber layer 160 can vary with thickness compared to the overall composition of the absorber layer 160.

In embodiments where the absorber layer 160 comprises selenium and tellurium, the atomic percent of the selenium in the absorber layer 160 can be greater than about 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can vary through the thickness of the absorber layer 160. For example, when the absorber layer 160 comprises a compound including selenium at a mole fraction of x and tellurium at a mole fraction of 1−x ($Se_xTe_{1-x}$), x can vary in the absorber layer 160 with distance from the first surface 162 of the absorber layer 160.

Referring still to FIG. 2, the absorber layer 160 can be doped with a dopant configured to manipulate the charge carrier concentration. In some embodiments, the absorber layer 160 can be doped with a Group I or V dopant such as, for example, copper, arsenic, phosphorous, antimony, or a combination thereof. The total density of the dopant within the absorber layer 160 can be controlled. Alternatively or additionally, the amount of the dopant can vary with distance from the first surface 162 of the absorber layer 160. In some embodiments, dopants are introduced during a passivation step in the manufacturing process. Passivation may include, for example, treatment with $CdCl_2$ or other halide compounds, and resulting dopants may include chlorine or other halogens. Additionally, the amount of a selected dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 4:
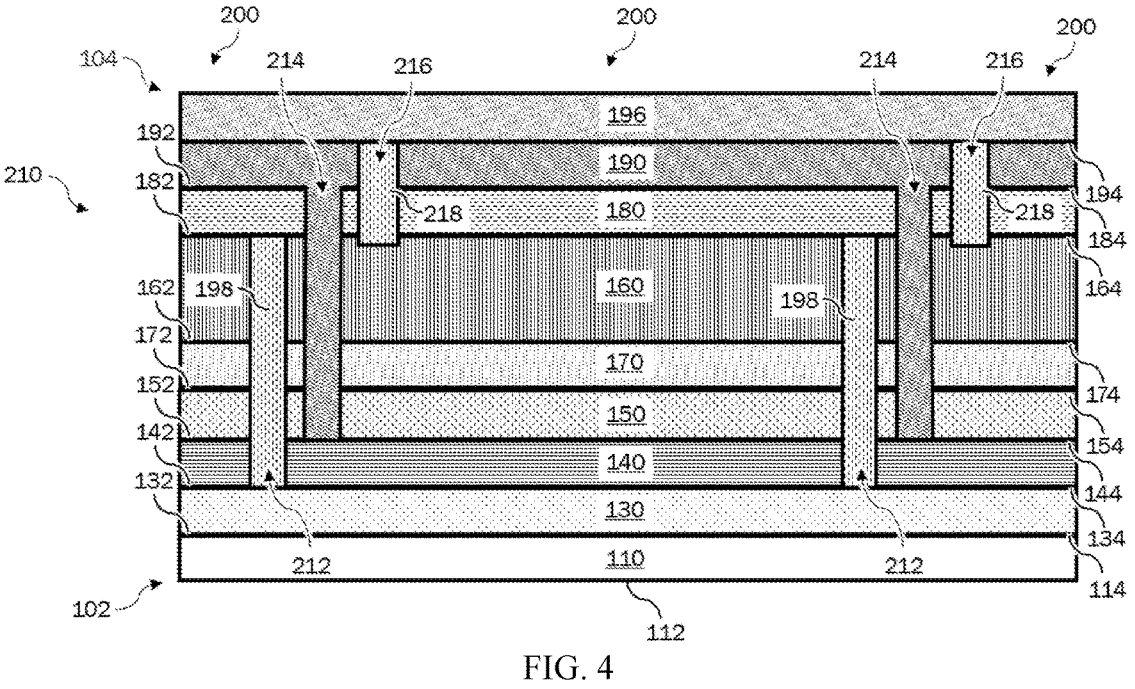
FIG. 4 schematically depicts a photovoltaic device according to one or more embodiments shown and described herein.

Referring now to FIG. 4, in some embodiments, a photovoltaic device 210 can include a window layer 170 comprising n-type semiconductor material. The absorber layer 160 can be formed adjacent to the window layer 170. The window layer 170 can have a first surface 172 substantially facing the energy side 102 of the photovoltaic device 100 and a second surface 174 substantially facing the opposing side 104 of the photovoltaic device 100. In some embodiments, the window layer 170 can be positioned between the absorber layer 160 and the TCO layer 20. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof. The material of the window layer 170 can include dopants.

Referring collectively to FIGS. 2 and 4, the photovoltaic device 100, 210 can include a back contact layer 180 configured to mitigate undesired alteration of the dopant and to provide electrical contact to the absorber layer 160. The back contact layer 180 can have a first surface 182 substantially facing the energy side 102 of the photovoltaic device 100 and a second surface 184 substantially facing the opposing side 104 of the photovoltaic device 100. A thickness of the back contact layer 180 can be defined between the first surface 182 and the second surface 184. The thickness of the back contact layer 180 can be between about 5 nm to about 200 nm such as, for example, between about 10 nm to about 50 nm in one embodiment.

In some embodiments, the back contact layer 180 can be provided adjacent to the absorber layer 160. For example, the first surface 182 of the back contact layer 180 can be provided upon the second surface 164 of the absorber layer 160. In some embodiments, the back contact layer 180 can include binary or ternary combinations of materials from Groups I, II, VI, such as for example, one or more layers containing zinc, copper, cadmium, and tellurium in various compositions. Further exemplary materials include, but are not limited to, zinc telluride doped with copper telluride, or zinc telluride alloyed with copper telluride.

The photovoltaic device 100 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact layer 180. For example, the first surface 192 of the conducting layer 190 can be provided upon the second surface 184 of the back contact layer 180. The conducting layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100, 210 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to the conducting layer 190. The back support 196 can include any suitable material, including, for example, glass (e.g., soda-lime glass). In some embodiments, an encapsulation layer can also function as the back support 196.

Figure 5:
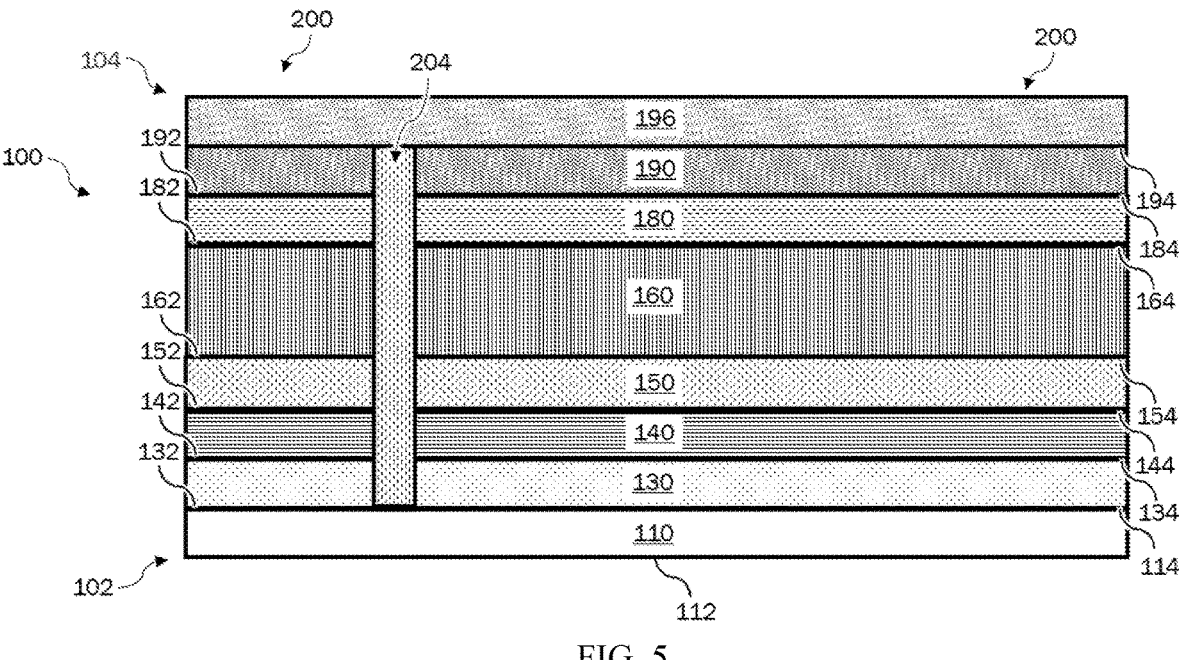
FIG. 5 schematically depicts a cross-sectional view along 5-5 of the photovoltaic device of FIG. 1 according to one or more embodiments shown and described herein.

Referring collectively to FIGS. 2, 4, and 5, manufacturing of a photovoltaic device 100, 210 generally includes sequentially disposing functional layers or layer precursors in a "stack" of layers through one or more thin film deposition processes, including, but not limited to, sputtering, spray, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). In some embodiments, VTD may be preferred for greater throughput quality. Manufacturing may also include annealing and passivating steps.

Manufacturing of photovoltaic devices 100, 210 can further include the selective removal of the certain layers of the stack of layers, i.e., scribing, to divide the photovoltaic device into 100, 210 a plurality of photovoltaic cells 200. For example, the serial scribes 202 can comprise a first isolation scribe 212 (also referred to as a P1 scribe), a series connecting scribe 214 (also referred to as a P2 scribe), and a second isolation scribe 216 (also referred to as a P3 scribe). The first isolation scribe 212 can be formed to ensure that the TCO layer 140 is electrically isolated between cells 200. Specifically, the first isolation scribe 212 can be formed though the TCO layer 140, the buffer layer 150, and the absorber layer 160 of photovoltaic device 100, or though the TCO layer 140, the buffer layer 150, the window layer 170, and the absorber layer 160 of the photovoltaic device 210. The first isolation scribe 212 bounding the reverse operation cell 208 can be filled with a dielectric material 198.

Referring again to FIGS. 2 and 4, the series connecting scribe 214 can be formed to electrically connect photovoltaic cells 200 in series. For example, the series connecting scribe 214 can be utilized to provide a conductive path from the conductive layer 190 of one of the photovoltaic cells 200 to the TCO layer 140 of another of the photovoltaic cells 200. The series connecting scribe 214 can be formed through the absorber layer 160, and the back contact layer 180 of photovoltaic device 100, or through the window layer 170, the absorber layer 160, and the back contact layer 180 of the photovoltaic device 210. Optionally, the series connecting scribe 214 can be formed through some or all of the buffer layer 150. Accordingly, the series connecting scribe 214 can be formed after the back contact layer 180 is deposited. The series connecting scribe 214 can then be filled with a conducting material such as, but not limited to, the material of the conducting layer 190. In some embodiments, the conductive material can be more conductive in reverse bias relative to forward bias.

The second isolation scribe 216 can be formed to isolate the back contact 190 into individual cells 200. The second isolation scribe 216 can be formed through the conductive layer 190, the back contact layer 180, and at least a portion of the absorber layer 160. The second isolation scribe 216 can be filled with a dielectric material 218.

Referring collectively to FIGS. 1 and 5, a parallel scribe 204 (also referred to as a P4 scribe) can be formed to isolate groups 206 of cells 200 from one another. In some embodiments, each group 206 can comprise multiple photovoltaic cells 200 connected in series such as, for example, via the series connecting scribe 214. The parallel scribe 204 can be formed through the conductive layer 190, the back contact layer 180, the absorber layer 160, the buffer layer 150, the TCO layer 140, the barrier layer 130, and the window layer 170 (when present). According to the embodiments provided herein, each of the parallel scribe 204, the first isolation scribe 212, the series connecting scribe 214, and the second isolation scribe 216 can be formed via laser cutting or laser scribing. In some embodiments, the parallel scribe 204 can be filled with a dielectric material.

Figure 6:
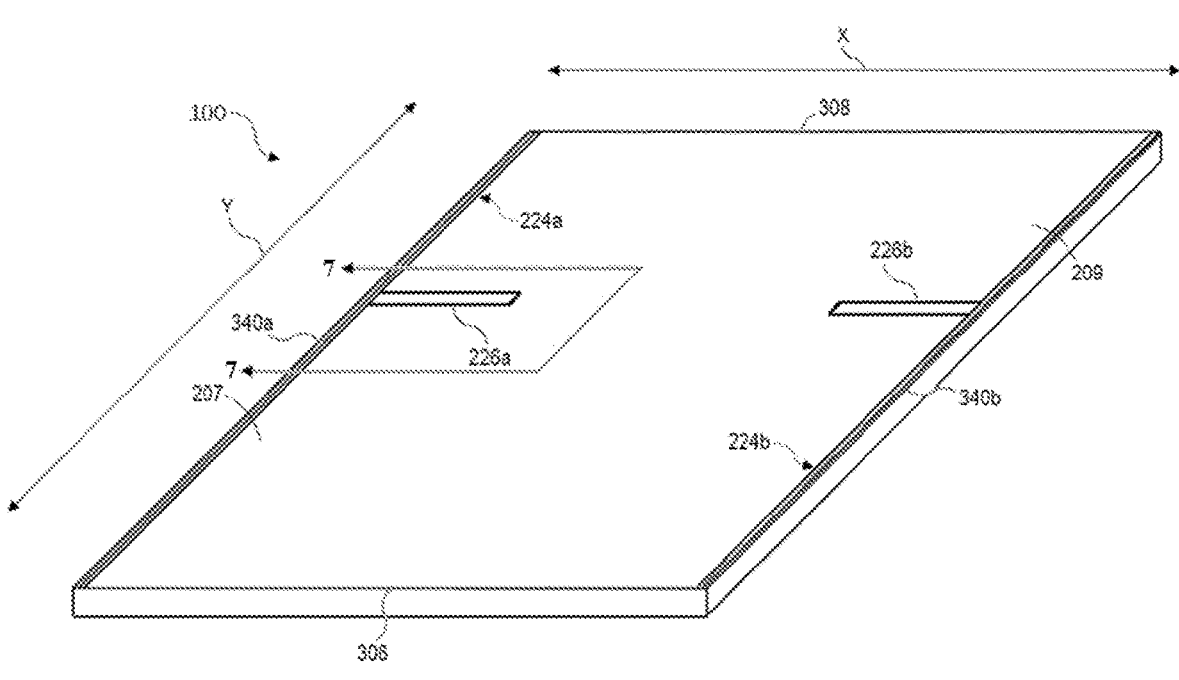
FIG. 6 schematically depicts a photovoltaic device according to one or more embodiments shown and described herein.
Figure 7:
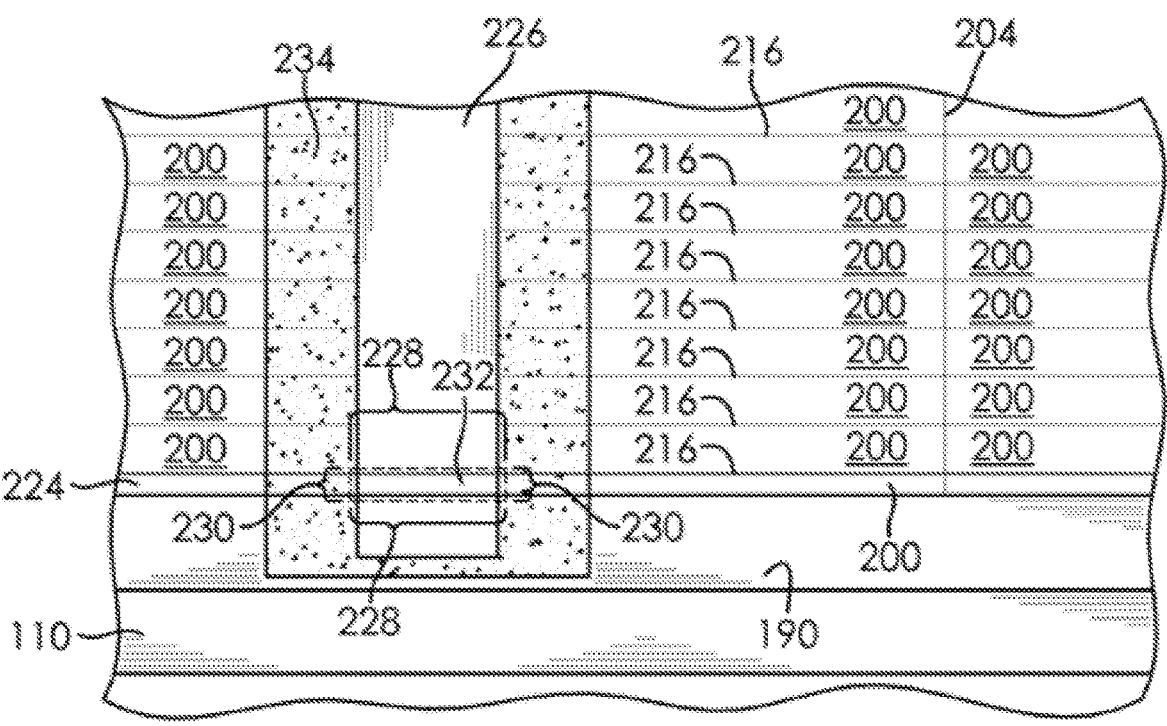
FIG. 7 schematically depicts a T-joint shaped contact between current collection portions the photovoltaic device according to one or more embodiments shown and described herein, showing a view along 7-7 of the photovoltaic device of FIG. 6.

With reference now to FIGS. 5-7, an embodiment of the photovoltaic device 100, 210 is shown. A plurality of photovoltaic cells 200 is formed on a substrate 110, where each of the photovoltaic cells 200 includes an absorber layer 160 and a conducting layer 190, the conducting layer 190 having a first surface 192 and a second surface 194, the first surface 192 of the conducting layer 190 facing the absorber layer 160. A bus member 224 is electrically coupled to the second surface 194 of the conducting layer 190 of at least one of the plurality of photovoltaic cells 200, where the bus member 224 is operable to collect current generated by the plurality of photovoltaic cells 200. A conductive member 226 is provided that has a portion 228 thereof adjacent a portion 230 of the bus member 224 to define a connection region 232 therebetween. The conductive member 226 extends from the connection region 232 over a portion of the plurality of photovoltaic cells 200. An insulating material 234 electrically insulates the conductive member 226 from the second surface 194 of the conducting layer 190 of the portion of the plurality of photovoltaic cells 200. An electrically conductive adhesive layer is disposed between the bus member 224 and the conductive member 226 within the connection region 232. Direct contact is made between the bus member 224 and the conductive member 226 through the electrically conductive adhesive layer within the connection region 232.

With reference again to FIG. 7, it can be seen that the portion 228 of the conductive member 226 adjacent the portion 230 of the bus member 224 that defines the connection region 232 therebetween is provided by having the portion 230 of the bus member 224 overlap the portion 228 of the conductive member 226. It can be further seen that the bus member 224 crosses over the conductive member 226 at the connection region 232. In this way, the bus member 224 can be electrically coupled to the second surface 194 of the conducting layer 190 of one or more photovoltaic cells 200 on each side of the conductive member 226, where the bus member 224 is hence operable to collect current generated by the photovoltaic cells 200 on each side of the conductive member 226.

Figure 8:
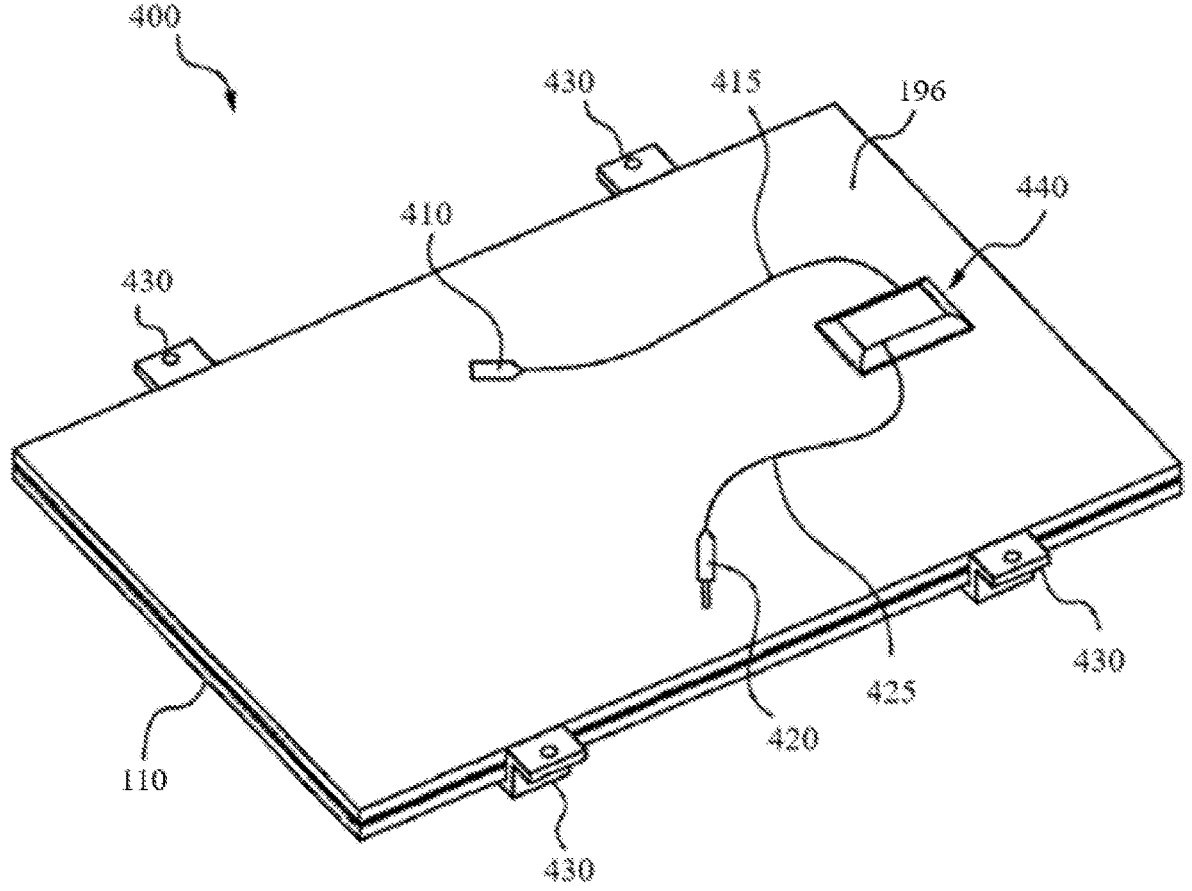
FIG. 8 schematically depicts a back view of a photovoltaic device.

After the layer stack with scribes is formed, bussing may be added as described above and in more detail below, and the photovoltaic device may be assembled. An encapsulation layer may be applied and the semiconductor layers may be sealed relative to rain, snow, and other metrological elements. Referring now to FIG. 8, the substrate 110 and the back support 196 may be laminated together so as to encapsulate the photovoltaic cells 200. The substrate 110 has a width and a length and the back support 196 may have substantially the same width and length as the substrate 110. Each of the substrate 110 and the back support 196 can include any suitable protective material such as, for example, borosilicate glass, float glass, soda lime glass, carbon fiber, or polycarbonate. Alternatively, the back support 196 may be any suitable material such as a polymer-based back sheet. The back support 196 and substrate 110 can protect the various layers of the photovoltaic device 100 from exposure to moisture and other environmental hazards. FIG. 8 shows a perspective view of the back side of an example of a completed module. The module assembly 400 may include the layers described and depicted in FIGS. 1-5, as well as bussing, encapsulation, and electrical connectors. The photovoltaic module assembly 400 may be configured to connect to a load through electrical connectors which pass through the junction box 440. The electrical connectors may include a first cable 415 with a first terminal 410, and a second cable 425 with a second terminal 420. The module assembly 400 may further include a supporting frame, bracket, or mount 430.

Referring now to FIGS. 5-7 and 9-14, the bussing may be added in a variety of manners and configurations. The bus members 224 can be metallic strips that may be added to the front and back sides of the photovoltaic device 100 to conduct direct current generated by the photovoltaic cells 200. In general, two bus members 224 may be added to the photovoltaic device 100, as described below and depicted in FIG. 6, to conduct direct current generated by the photovoltaic cells 200. Bus members 224 may also be referred to as busbars, bus conductors, common conductors, photovoltaic ribbon, or buses. Each bus member 224 can function as one of a common positive and negative conductor, electrically connected to the first cells 200 in a series or the last cells 200 in a series, for example.

It is understood that although FIGS. 9-14 depict bussing configurations near a peripheral edge 340, the photovoltaic device 100 may have a second peripheral edge on an opposing side and a corresponding bussing configuration near the second peripheral edge. In such embodiments, the bus member 224 near the peripheral edge 340 may act as a positive bus, and a second bus member near the second peripheral edge may act as a negative bus. For example, referring now to FIG. 6, a photovoltaic device 100 may have a first peripheral edge 340a on a first side 207 with a first bus member 224a extending along the length Y and a first conductive member 226a extending along the width X, and a second peripheral edge 340b on an opposing second side 209 with a second bus member 224b extending along the length Y and a second conductive member 226b extending along the width X. The photovoltaic device 100 may have a first side edge 306 and a second side edge 308 extending along the width X on opposing sides of the length Y, and each of the first side edge 306 and second side edge 308 may include a dead area similar to each peripheral edge 340a, 340b. However, for ease of illustration and explanation, only one peripheral edge 340 and one set of bus member 224 and conductive member 226 are depicted in FIGS. 9-14 and referred to. FIGS. 9-14 depict one set of bussing components which may be replicated on an opposing side of the photovoltaic device 100. Thus, for example, when referring to FIGS. 9-14, it is understood that the first photovoltaic cell 200a may alternatively be the last photovoltaic cell.

Referring now to FIGS. 9A-9E, a photovoltaic device 100 is depicted at certain sequential stages of a manufacturing process. The photovoltaic cells 200 may include a first cell 200a closest among the photovoltaic cells 200 to a dead area 301, which is formed by a suitable ablation method on a region of the photovoltaic device 100 extending inwardly from the peripheral edge 340 of the photovoltaic device 100. The first photovoltaic cell 200a is the photovoltaic cell 200 that is closest to the peripheral edge 340 of the photovoltaic device 100. In this embodiment, the first photovoltaic cell 200a is larger than each of the neighboring photovoltaic cells 200b, 200c, 200d, as described in more detail below. The photovoltaic cells 200 are separated by the parallel scribes 204.

Figures 9A, 9B:
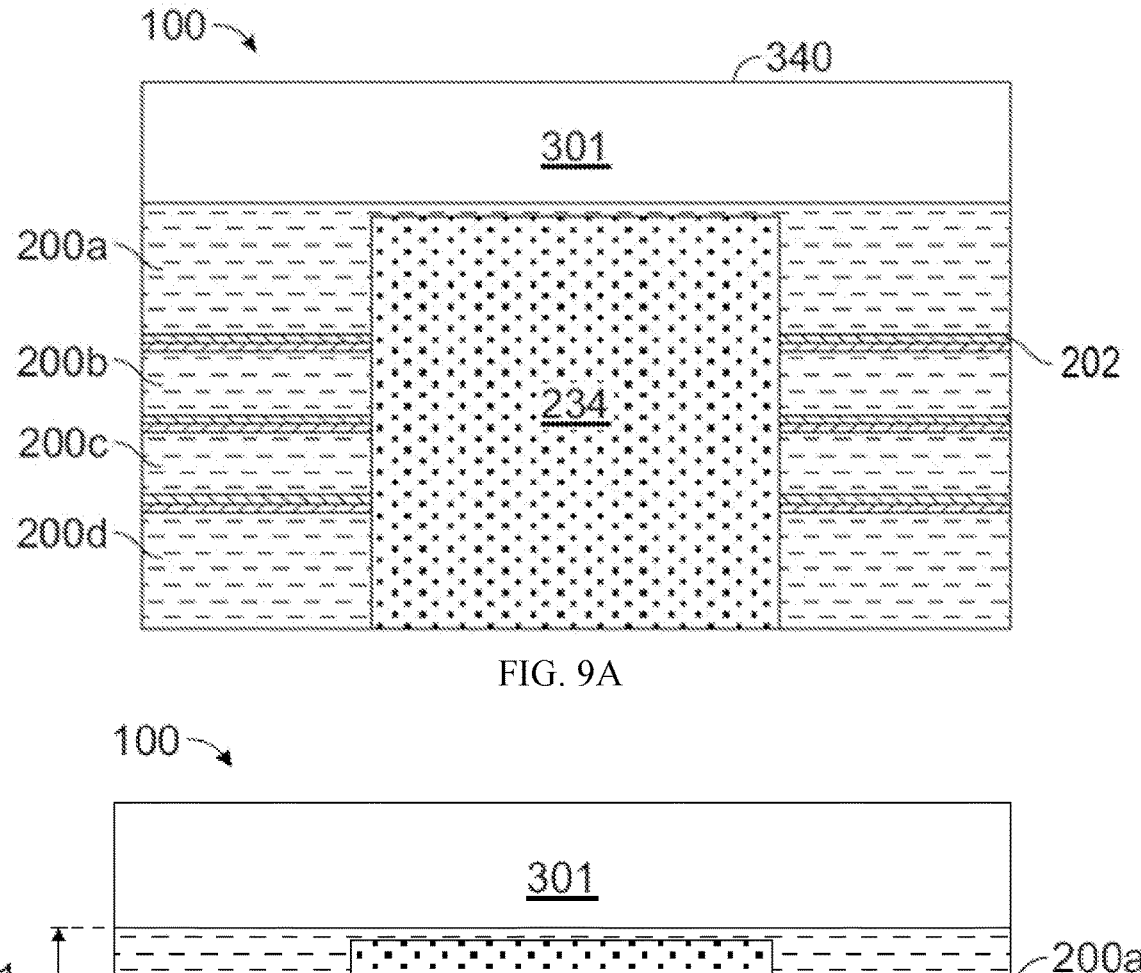
FIGS. 9A-9E schematically depict a photovoltaic device according to one or more embodiments shown and described herein during sequential steps of a manufacturing process.

Referring now to FIG. 9A, the insulating material 234 may be added on top of the photovoltaic cells 200, so as to extend over at least a portion of the first photovoltaic cell 200a. The insulating material 234 may extend over a plurality of the photovoltaic cells 200. FIG. 9A depicts the first photovoltaic cell 200a, the second photovoltaic cell 200b, the third photovoltaic cell 200c, and the fourth photovoltaic cell 200d, but it is understood that the insulating material 234 may be added over any number of the photovoltaic cells 200. Also, the insulating material 234 does not need to extend over the entire first photovoltaic cell 200a. Rather, as seen in FIG. 9A, the insulating material 234 may extend over only a portion of the first cell 200a, in which case the insulating material 234 does not contact the dead area 301.

The insulating material 234 may be, for example, a double sided tape. However, other electrically insulating materials are possible. The insulating material 234 may electrically insulate the conductive member 226 from the second surface 194 of the conducting layer 190 of the photovoltaic cells 200 that the insulating material 234 touches, and may also hold the conductive member 226 in place.

Referring now to FIG. 9B, the conductive member 226 may be added over the insulating material 234, such that the conductive member 226 is not in direct contact with the photovoltaic cells 200. Rather, the conductive member 226 may be in direct contact with the insulating material 234. In this manner, the insulating material 234 may electrically insulate the conductive member 226 from the photovoltaic cells 200. The conductive member 226 may be any conductive material such as, but not limited to, a metal.

Figure 9C:
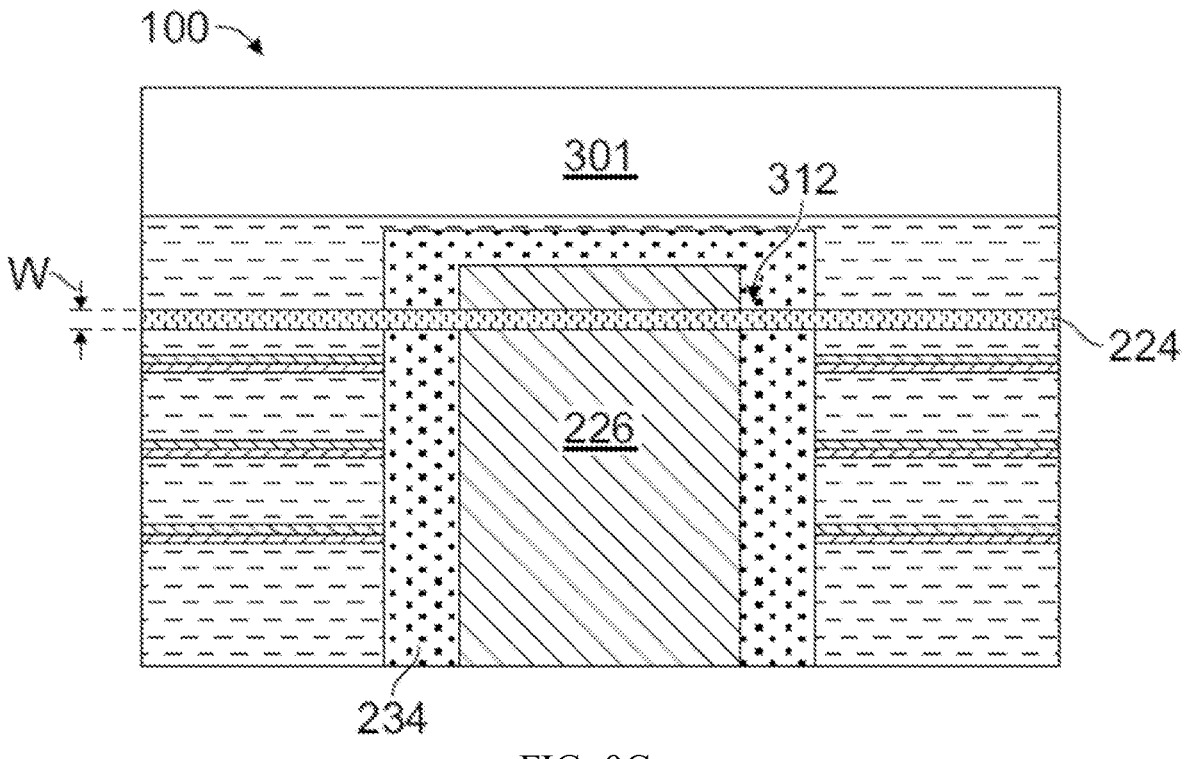

Referring now to FIG. 9C, the bus member 224 may be added on top of the conductive member 226 so as to extend across the first photovoltaic cell 200a, and to overlap the conductive member 226. The bus member 224 may be electrically coupled to the second surface 194 of the conducting layer 190 of the first photovoltaic cell 200a, such that the bus member 224 is operable to collect current generated by the plurality of photovoltaic cells 200. The bus member 224 may directly contact the first photovoltaic cell 200a, or the bus member 224 may alternatively be coupled to the first photovoltaic cell 200a through a conductive material or conductive adhesive. With reference to FIG. 6, the bus member 224 may extend along the length Y from a location near a dead area at the first side edge 306 of the photovoltaic device 100 to a location near a dead area at the second side edge 308 of the photovoltaic device 100. The bus member 224 may have a width W that extends in its entirety over the conductive member 226, and over the first photovoltaic cell 200a. As noted above, the bus member 224 may be connected to the conductive member 226 through an electrically conductive adhesive layer. In other embodiments, the bus member 224 may directly contact the conductive member 226. The bus member 224 is operable to carry photocurrent generated from the cells 200 to the conductive member 226. The conductive member 226, in turn, may be operable to carry the photocurrent to the junction box 440.

Referring again to FIG. 9C, the overlap of the bus member 224 over the conductive member 226 forms the configuration known as a T-joint 312. The bus member 224 may cross over the conductive member 226 in a substantially orthogonal manner. However, it is not necessary that the overlap of the bus member 224 over the conductive member 226 be substantially orthogonal.

Figure 9D:
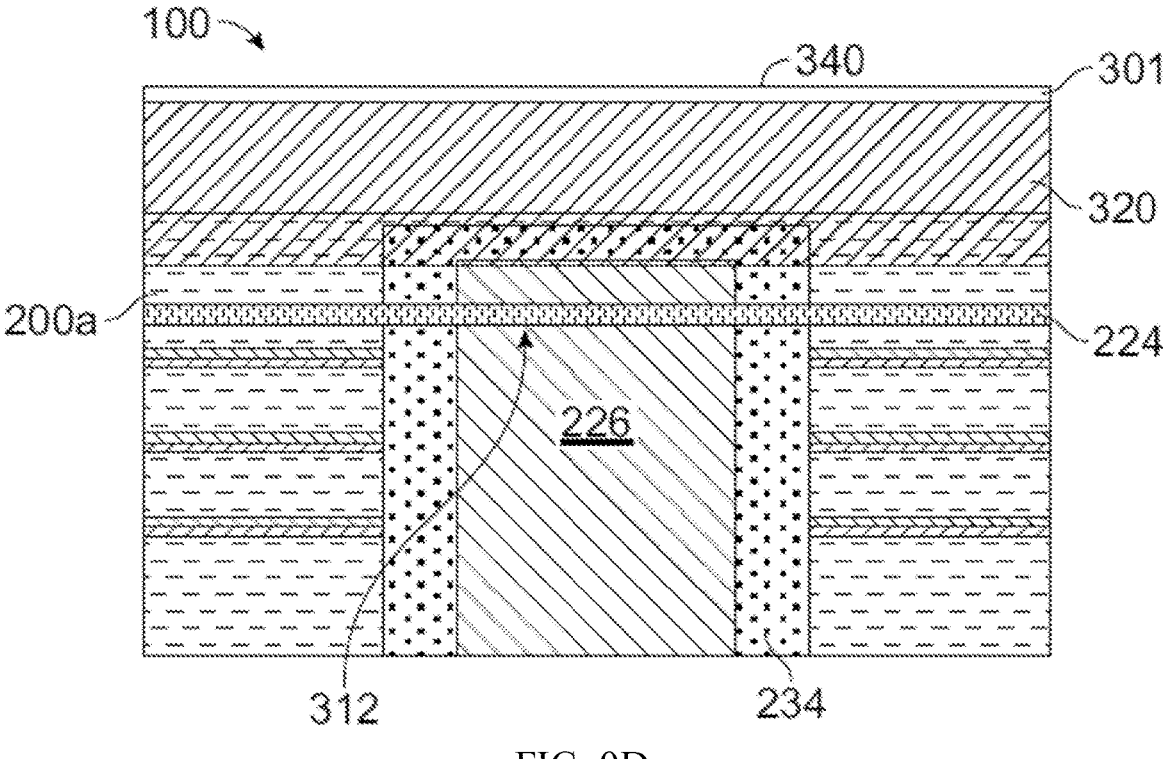

Referring now to FIG. 9D, an edge seal 320 may be added over a portion of the photovoltaic device 100, after adding the bus member 224. The edge seal 320 may extend along the length Y from a location near a dead area at the first side edge 306 to a location near a dead area at the second side edge 308, and may be at or near the peripheral edge 340 of the photovoltaic device 100. The edge seal 320 may cover a portion of the first photovoltaic cell 200a. A portion of the dead area 301 may remain between the edge seal 320 and the peripheral edge 340 of the photovoltaic device 100. However, in other embodiments, the edge seal 320 extends to the peripheral edge 340 such that there is no dead area 301 uncovered by the edge seal 320. In the embodiment depicted in FIG. 9D, the edge seal 320 does not cover the bus member 224. Thus, in this embodiment, the edge seal 320 does not cover the T-joint 312.

The edge seal 320 may protect the photovoltaic device 100 from moisture intrusion, foreign substances, and other environmental hazards. The edge seal 320 can also serve as an adhesive that bonds the device 100 together. Polyisobutylene (PIB), also known as butyl rubber, is a possible sealant material for the edge seal 320, though other examples of edge seal materials include, but are not limited to, opaque polymeric compounds. The edge seal material may also be dyed any desired color, and may contain any colorant. The edge seal material that forms the edge seal 320 may be applied in liquid hot melt form, in tape form, or by any other known technology. The liquid hot melt edge seal material may cool to a solid state when the substrate 110 and the back support 196 are combined during manufacturing. The cured edge seal material may be applied in liquid hot melt form during manufacturing using a hot melt process which may include a hot melt dispensing device, for example. The hot melt dispensing device may dispense the liquid edge seal material through an applicator attached to a hose, such that the liquid edge seal material is pumped from a dispensing pump connected to an edge seal material container. The edge seal material may also include a desiccant material.

Figure 9E:
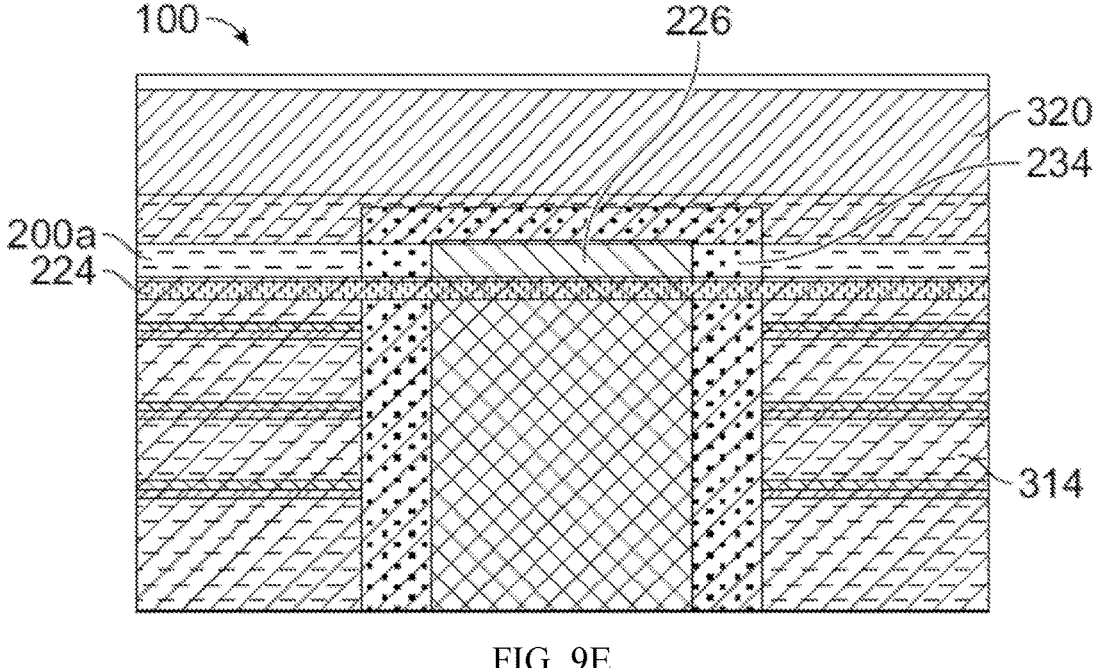

Referring now to FIG. 9E, an interlayer 314 may be added to the photovoltaic device 100. The interlayer 314 may extend along the length Y from a location near a dead area at the first side edge 306 to a location near a dead area at the second side edge 308 of the photovoltaic device 100. The interlayer 314 may be applied to extend over a portion of the first photovoltaic cell 200a, and may completely cover the bus member 224 from a location near a dead area at the first side edge 306 to a location near a dead area at the second side edge 308. In this manner, the bus member 224 is protected by the interlayer 314 during subsequent manufacturing processes, and is therefore less susceptible to being moved from the forces involved in subsequent manufacturing steps. Portions of the first photovoltaic cell 200a, the insulating member 234, and the conductive member 226 may remain uncovered by both the interlayer 314 and the edge seal 320.

The interlayer 314 may serve multiple functions. First, the interlayer 314 may serve as a moisture barrier between the back support 196 and the plurality of photovoltaic cells 200. By being a moisture barrier, the interlayer 314 may prevent moisture-induced corrosion from occurring inside the photovoltaic device 100. This, in turn, may increase the device's life expectancy. Second, the interlayer 314 may serve as an electrical insulator between the electrically conductive core of the photovoltaic device 100 and any accessible points exterior to the photovoltaic device 100. For example, the interlayer 314 may limit or prevent leakage current from passing from the back contact through the back support 196 of the photovoltaic device 100. Third, the interlayer 314 may serve as a bonding agent that attaches the back support 196 to the rest of the photovoltaic device 100. During manufacturing, a lamination process may heat the interlayer 314 under vacuum to allow the material to wet-out any adjacent adherent surfaces, and in some cases initiate a cross-linking reaction. This process may promote bonding between the interlayer 314 and the back support 196 as well as between the interlayer 314 and the conducting layer 190. The interlayer 314, therefore, may serve as a bonding agent within the photovoltaic device 100.

The interlayer 314 may include any suitable materials such as, for example, ethylene (EVA), polyvinyl butyral (PVB), polydimethylsiloxane (PDMS), polyiso-butylene (PIB), polyolefin, thermoplastic polyurethane (TPU), polyurethane, epoxy, silicone, ionomer, or a combination thereof. In some embodiments, the interlayer 314 may include a base material and a filler material. The base material may be any of ethylene (EVA), polyvinyl butyral (PVB), polydimethylsiloxane (PDMS), polyiso-butylene (PIB), polyolefin, thermoplastic polyurethane (TPU), polyurethane, epoxy, silicone, ionomer, or a combination thereof. The filler material can contain a flame retardant material, a desiccant material, a pigment, an inert material, or any combination thereof.

As noted above, the photovoltaic device depicted in FIGS. 9A-9E may include a first photovoltaic cell 200a that is larger in size than the neighboring photovoltaic cells 200b, 200c, 200d. Specifically, the first photovoltaic cell 200a may extend for a distance $d_1$ that is larger than each of the distance $d_2$ that the second photovoltaic cell 200b extends, the distance $d_3$ that the third photovoltaic cell 200c extends, and the distance $d_4$ that the fourth photovoltaic cell 200d extends. This allows for covering of the bus member 224 with the interlayer 314 without sacrificing edge seal width that is important to prevent moisture ingress from the environment. If the first photovoltaic cell 200a were not larger than the other photovoltaic cells 200b, 200c, 200d, then the interlayer 314 and the edge seal 320 may run on top of each other during the manufacturing process unless the edge seal 320 width is reduced, both of which would reduce the effectiveness of the edge seal 320 as a moisture barrier. Furthermore, if the first photovoltaic cell 200a were not larger than the other photovoltaic cells 200b, 200c, 200d, then the interlayer 314 would be deposited over a larger area of the photovoltaic device 100—and therefore require a greater amount of interlayer material—in order to reach and cover the bus member 224, which extends over and is electrically coupled to the first photovoltaic cell 200a so as to collect the current generated from all of the photovoltaic cells 200 connected in series. Thus, as seen in FIG. 9E, the interlayer 314 may cover the bus member 224, and may cover a portion of the first photovoltaic cell 200a to do so. Consequently, the interlayer 314 may protect the bus member 224 during subsequent manufacturing steps, during which the bus member 224 may otherwise become physically dislodged. However, because the photovoltaic cells 200 are connected in series, the larger cell size of the first photovoltaic cell 200a does not result in a greater electric current being passed through the photovoltaic cells 200 to the bus member 224. Therefore, improved device efficiency can be achieved with bussing configurations that reduce the size of the first photovoltaic cell 200a while still protecting the bus member 224. Provided herein are photovoltaic devices having bussing configurations that provide for a reduction of the first photovoltaic cell size, and therefore realize higher device efficiency, while still protecting the bus member 224 during manufacturing.

Figure 10A:
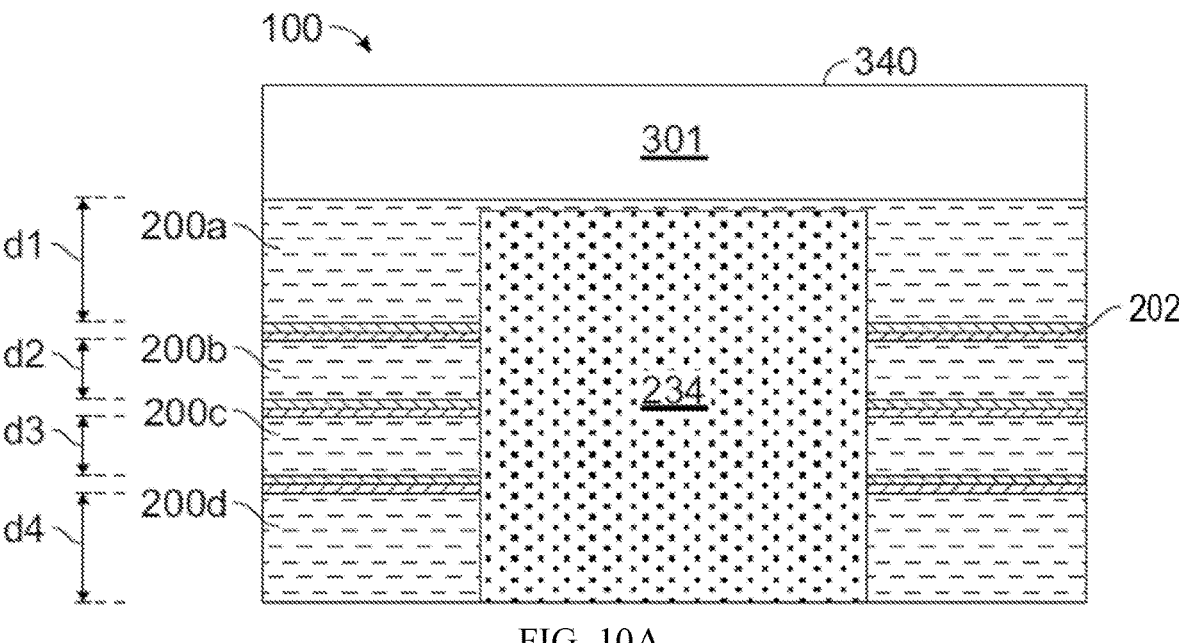
FIGS. 10A-10E schematically depict a photovoltaic device according to one or more embodiments shown and described herein during sequential steps of a manufacturing process.

Referring now to FIGS. 10A-10E, a photovoltaic device 100 at certain sequential steps of a manufacturing process is depicted. As seen in FIG. 10A, a dead area 301 abutting the peripheral edge 340 of the photovoltaic device 100 may be created by a suitable ablation method. The photovoltaic device 100 may include a first photovoltaic cell 200a adjacent to the dead area 301, a second photovoltaic cell 200b, a third photovoltaic cell 200c, and a fourth photovoltaic cell 200d, separated by the serial scribes 202. It is understood that four photovoltaic cells 200 are depicted for illustration purposes, but the number of photovoltaic cells 200 is not particularly limited. In this embodiment, the first photovoltaic cell 200a has a smaller size compared to in the embodiment depicted in FIGS. 9A-9E. The distance $d_1$ that the first photovoltaic cell 200a extends may still be larger than each of the distances $d_2$, $d_3$, $d_4$ that the neighboring photovoltaic cells 200d, 200c, 200d extend, but the distance $d_1$ that the first photovoltaic cell 200a extends may be smaller than the distance $d_1$ that the first photovoltaic cell 200a extends in the embodiment depicted in FIGS. 9A-9E.

Referring now to FIG. 10A, the insulating material 234 may be added over the photovoltaic cells 200 in the same manner as previously described. The insulating material 234 may cover any number of the photovoltaic cells 200, provided that the insulating material 234 extends over at least a portion of the first photovoltaic cell 200a. It is not necessary that the insulating material 234 extend to the dead area 301, though the insulating material 234 may extend to the dead area 301.

Figure 10B:
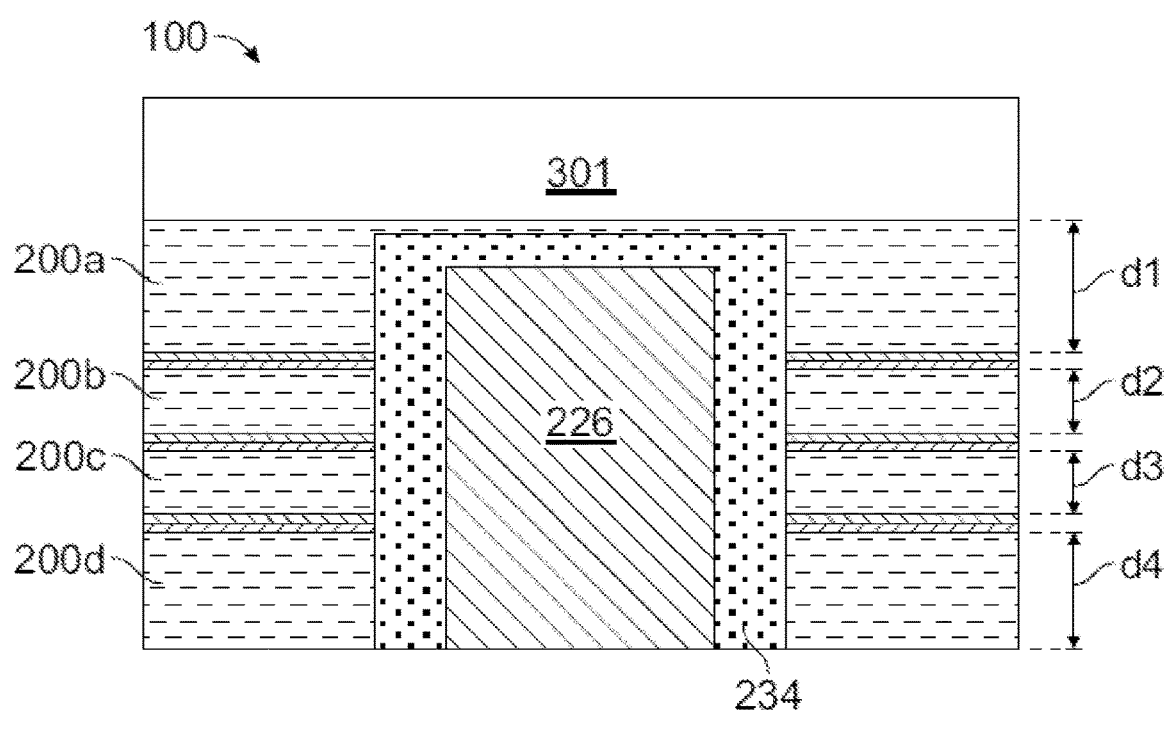

Referring now to FIG. 10B, the conductive member 226 may be deposited on the insulating material 234. The conductive member 226 may not be in direct contact with the photovoltaic cells 200, but may be in direct contact with the insulating material 234. In this manner, the insulating material 234 may serve to electrically insulate the conductive member 226 from the second surface 194 of the conducting layer 190 of the photovoltaic cells 200. The insulating material 234 may also hold the conductive member 226 in place during subsequent manufacturing steps.

Figure 10C:
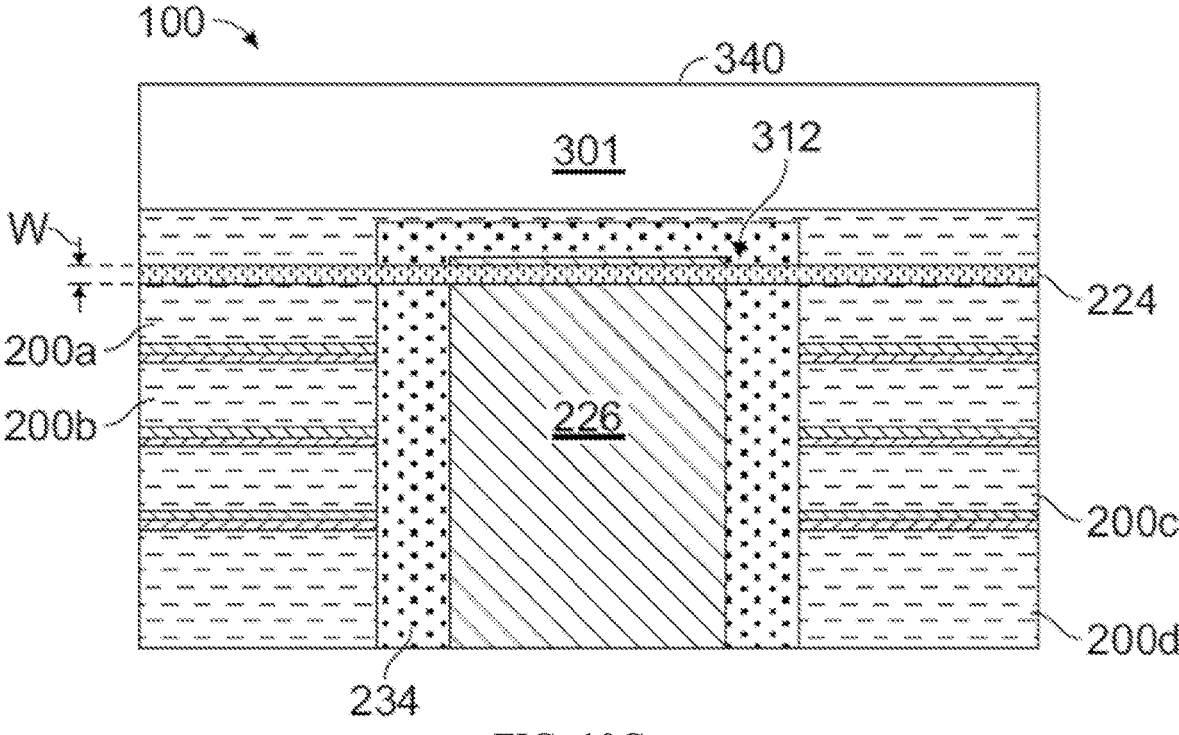

Referring now to FIG. 10C, the bus member 224 may be added over the conductive member 226, insulating material 234, and the first photovoltaic cell 200a. The bus member 244 may extend along the length Y from a location near a dead area at the first side edge 306 of the photovoltaic device 100 to a location near a dead area at the second side edge 308 of the photovoltaic device 100. The bus member 224 may have a width W that extends in its entirety over the conductive member 226, and over the first photovoltaic cell 200a. The T-joint 312 is formed by the bus member 224 overlapping the conductive member 226, which may be in a substantially orthogonal manner (thus resembling a "T" shape). However, it is not necessary that the extension of the bus member 224 over the conductive member 226 be substantially orthogonal.

Figure 10D:
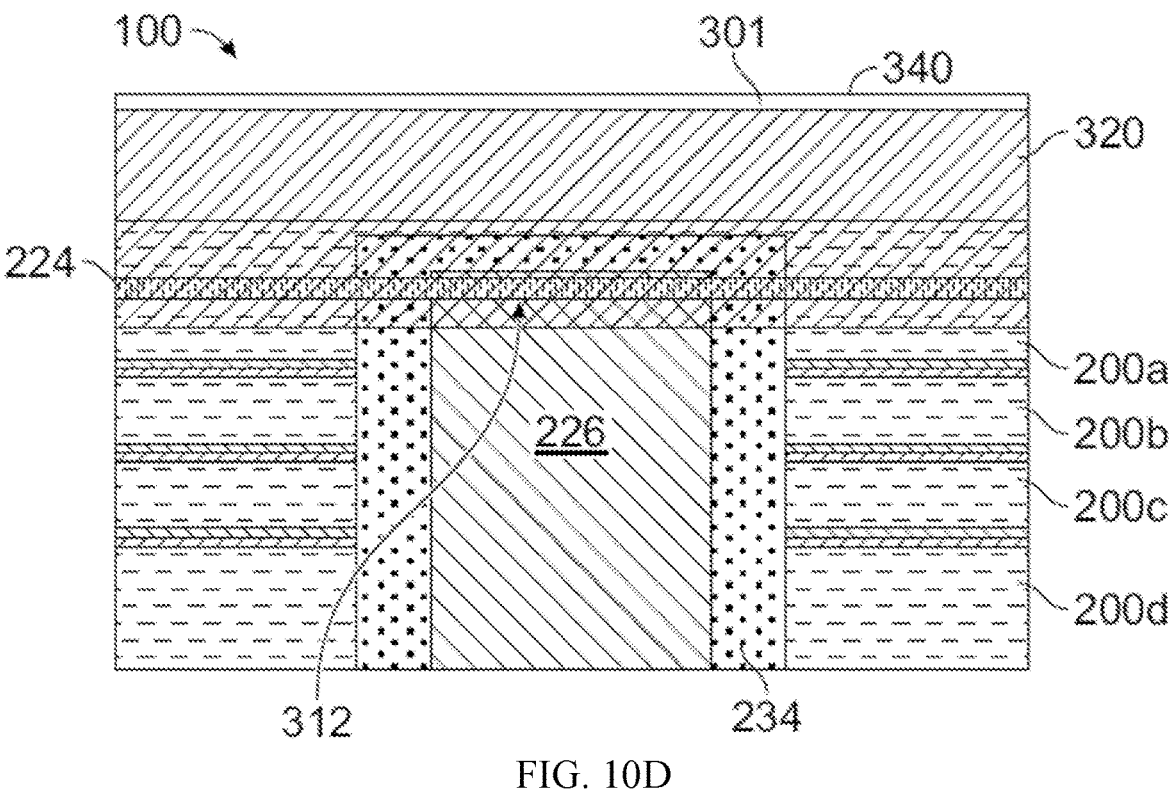

Referring now to FIG. 10D, the edge seal 320 may be added over the dead area 301 and the T-joint 312 from a location near a dead area at the first side edge 306 to a location near a dead area at the second side edge 308, so as to completely cover the T-joint 312. It is not necessary that the edge seal 320 extend all the way to the peripheral edge 340. Rather, some portion of the dead area 301 may remain uncovered by the edge seal 320. However, in some embodiments, the edge seal 320 may extend all the way to the peripheral edge 340, leaving no dead area 301 uncovered by the edge seal 320. Advantageously, in the embodiment depicted in FIG. 10D, the edge seal 320 fully covers the bus member 224 during subsequent manufacturing steps (such as a lamination process), thereby protecting the bus member 224 during subsequent manufacturing steps.

Figure 10E:
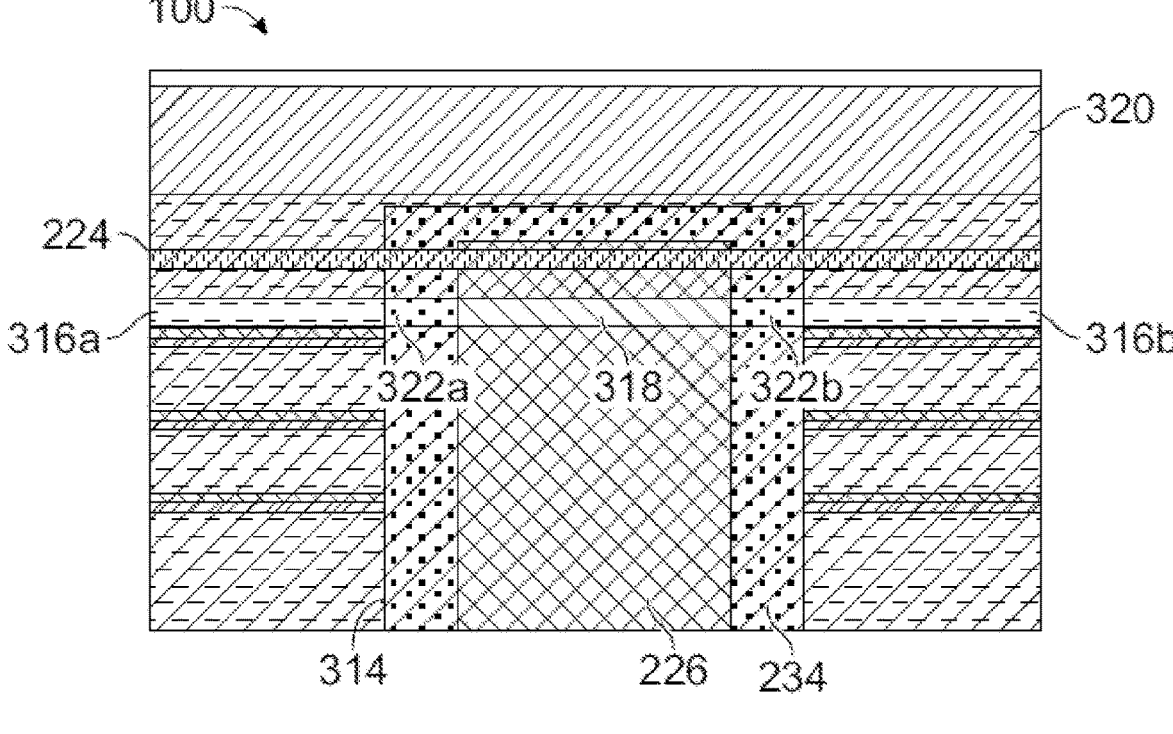

Referring now to FIG. 10E, the interlayer 314 may be added over the photovoltaic cells 200b, 200c, 200d, and a portion of the first photovoltaic cell 200a. Two regions 316a, 316b of the first photovoltaic cell 200a, on opposing sides of the insulating material 234, may remain uncovered by the edge seal 320 and uncovered by the interlayer 314. Similarly, a region 318 of the conductive member 226 and two regions 322a, 322b of the insulating material 234 may remain uncovered by the edge seal 320 and uncovered by the interlayer 314. In this embodiment, the interlayer 314 is not used to cover the bus member 224 because the edge seal 320 covers the bus member 224. Accordingly, less interlayer material may be used than if the interlayer 314 were to cover the bus member 224.

As seen in FIG. 10C, the bus member 224 may be deposited over the conductive member 226 and the insulating material 234 in an area closer to the peripheral edge 340 of the photovoltaic device 100 than in the embodiment depicted in FIGS. 9A-9E. This is because, in the embodiment depicted in FIGS. 10A-10E, the bus member 224 (and the T-joint 312) are wholly covered by the edge seal 320 instead of the interlayer 314, and therefore the amount of interlayer material needed to cover the bus member 224 is not a factor for determining the positioning of the bus member 224. Consequently, the first photovoltaic cell 200a may be made smaller than in the embodiment depicted in FIGS. 9A-9E, because there is no need for the interlayer 314 to reach to the bus member 224, and therefore no need to use an undesirable amount of interlayer material. Because this embodiment allows for the T-joint 312 to be closer to the peripheral edge 340 while still being covered and protected during subsequent manufacturing steps, the distance $d_1$ that the first photovoltaic cell 200a extends may be reduced so as to be closer in size to the distance $d_2$ that the second photovoltaic cell 200b extends, or the distances that the neighboring photovoltaic cells 200c, 200d extend. In this manner, overall efficiency of the photovoltaic device 100 may be improved.

Referring now to FIGS. 11A-11E, an alternative embodiment of a photovoltaic device 100 at certain sequential steps during a manufacturing process is depicted. In this embodiment, the T-joint 312 is covered by the edge seal 320, but less edge seal material is used compared to the embodiment depicted in FIGS. 10A-10E.

Figures 11A, 11B:
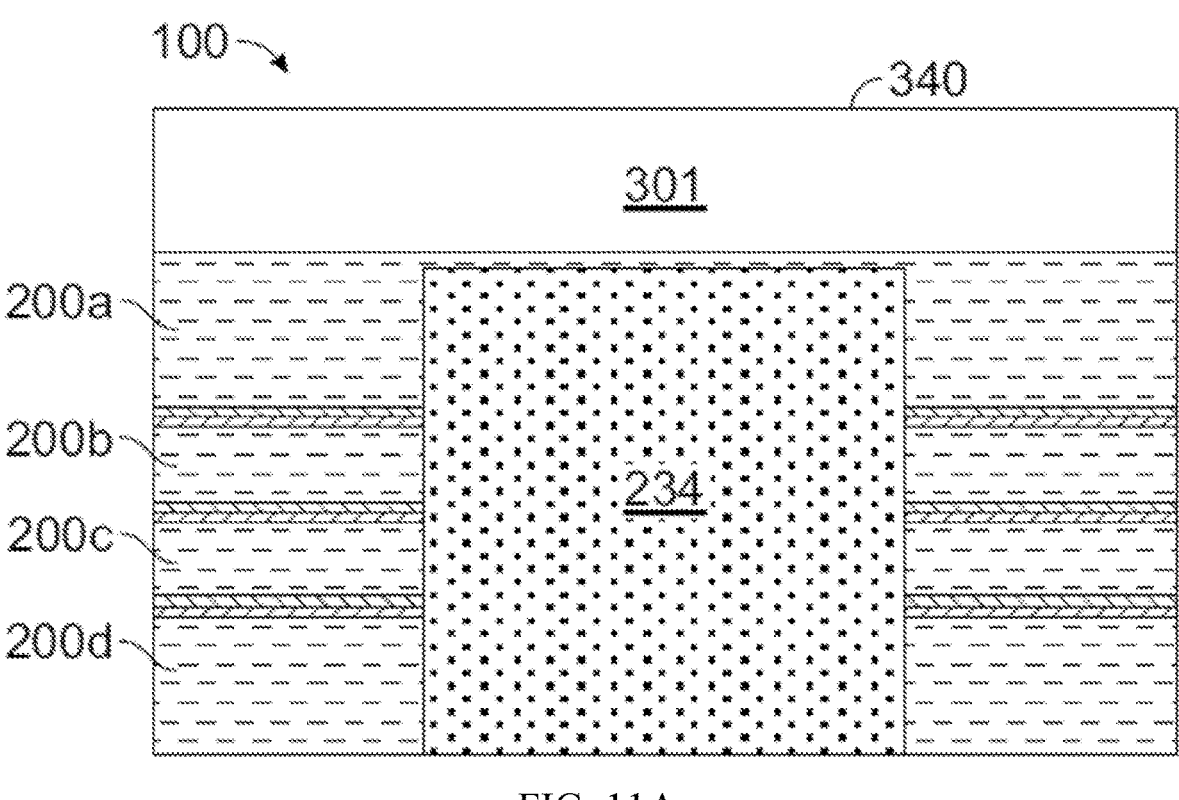
FIGS. 11A-11E schematically depict a photovoltaic device according to one or more embodiments shown and described herein during sequential steps of a manufacturing process.

Referring now to FIG. 11A, the insulating material 234 may be added over the photovoltaic cells 200 in the same manner as before, extending over at least a portion of the first photovoltaic cell 200a. A dead area 301 may be created by a suitable ablation method adjacent to the peripheral edge 340 of the photovoltaic device 100. The dead area 301 may extend along the length Y from the first side edge 306 to the second side edge 308. The first photovoltaic cell 200a is adjacent to the dead area 301.

Referring now to FIG. 11B, the conductive member 226 may be added over the insulating material 234 as previously described. The conductive member 226 may be positioned over at least a portion of the first photovoltaic cell 200a. The conductive member 226 may extend over a plurality of the photovoltaic cells 200. The conductive member 226 may contact the dead area 301. In other embodiments, the conductive member 226 and the dead area 301 do not contact one another.

Figures 11C, 11D:
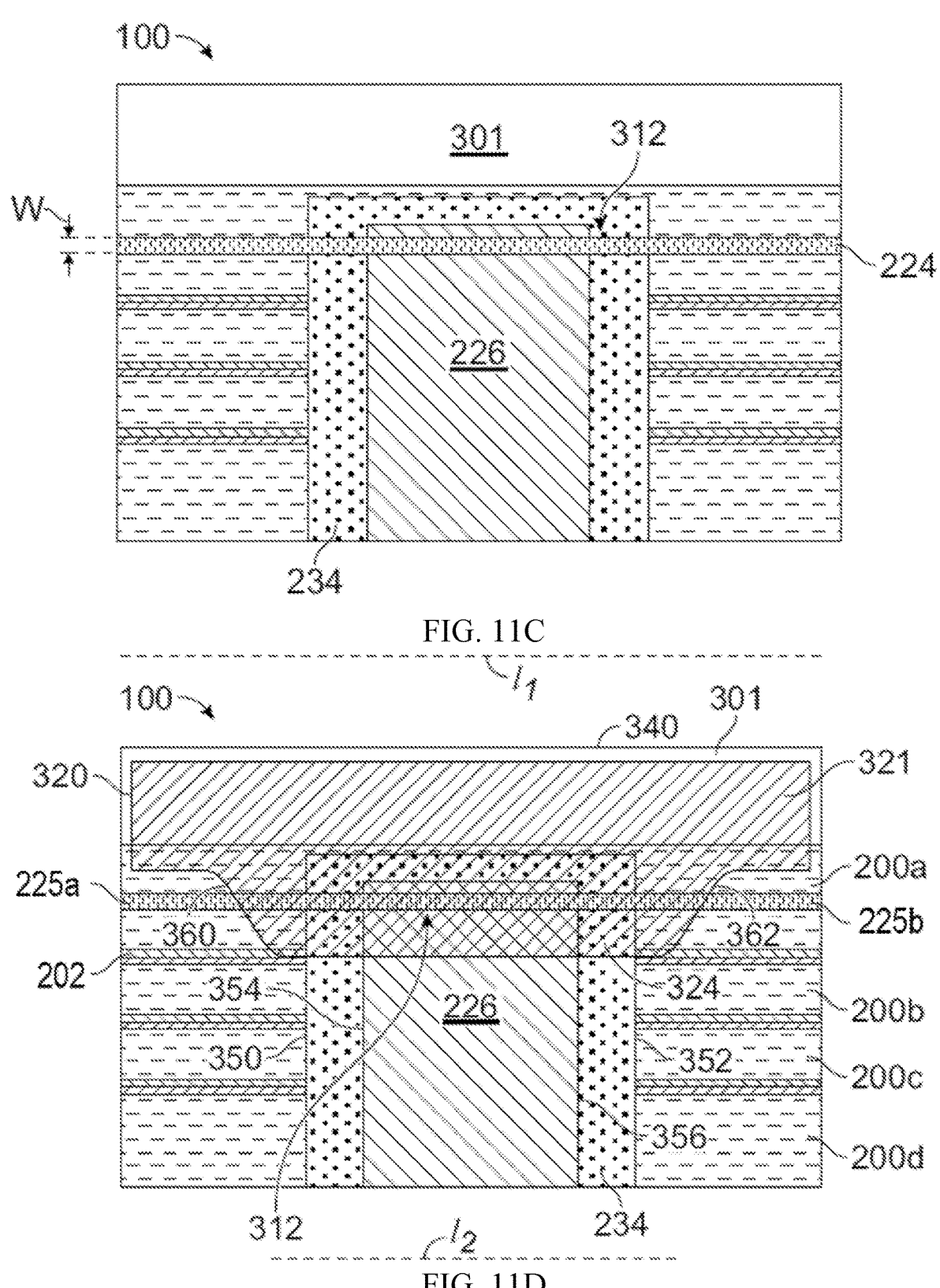

Referring now to FIG. 11C, the bus member 224 may be added over the conductive member 226 to form a T-joint 312 where the bus member 224 overlaps the conductive member 226. The bus member 224 may extend from a location near a dead area at the first side edge 306 to a location near a dead area at the second side edge 308 of the photovoltaic device 100. The bus member 224 may have a width W that extends in its entirety over the conductive member 226, and over the first photovoltaic cell 200a. The bus member 224 may be electrically coupled to the first photovoltaic cell 200a, and electrically coupled to the conductive member 226. The bus member 224 may be in direct contact with the first photovoltaic cell 200a, or may alternatively be electrically coupled thereto through a conductive metal or a conductive adhesive. The bus member 224 may be in direct contact with the conductive member 226, or may alternatively be electrically coupled thereto through a conductive adhesive.

Referring now to FIG. 11D, the edge seal 320 may be formed in a shape that includes a tab 324 extending over the T-joint 312. The edge seal 320 may be disposed along or near the peripheral edge 340, but need not extend all the way to the peripheral edge 340. Rather, as seen in FIG. 11D, some of the dead area 301 may remain uncovered by the edge seal 340. Some of the edge seal 320 may extend along the length Y from a location near a dead area at the first side edge 306 to a location near a dead area at the second side edge 308, while the tab 324 does not extend along then length Y to the same extent. Rather, the tab 324 may have a shorter length $l_2$ compared to the length $l_1$ of the remaining edge seal 320. The edge seal 320 may include side portions 360, 362 which extend from the region 321 of the edge seal 320 having the longer length $l_1$ to the tab 324 having the shorter length $l_2$. The side portions 360, 362 may be angular, as seen in FIG. 11D, or may alternatively be substantially parallel to the first side edge 306 and the second side edge 308.

The tab 324 of the edge seal 320 may extend to a position over the serial scribe line 202 separating the first photovoltaic cell 200a from the second photovoltaic cell 200b. The remaining portion of the edge seal 320, between the tab 324 and the peripheral edge 340, may cover only a portion of the first photovoltaic cell 200a. In this embodiment, the edge seal 320 is defined by a region 321 having a first length $l_1$ from the first side edge 320 to the side portion 360 which extends inwardly from the peripheral edge 340 to the serial scribe line 202, and then the tab 324 having a second length $l_2$ from the side portion 360 over the T-joint 312 to the side portion 362, which extends back to the region 321 having the first length $l_1$. The edge seal 320 may have the first length $l_1$ over the dead area 301, and the second length $l_2$ over the T-joint 312, where the first length $l_1$ is greater than the second length $l_2$.

Referring to FIG. 11D, the tab 324 may extend over the bus member 224 from the first side edge 350 of the insulating material 234 to the second side edge 352 of the insulating material 234. In other embodiments, the tab 324 may extend over the bus member 224 from the first side edge 354 of the conductive member 226 to the second side edge 356 of the conductive member 226. The tab 324 may extend over the serial scribe line 202, and may extend over some portions of the first photovoltaic cell 200a to the sides of the insulating material 234. However, this is not necessary.

Figure 11E:
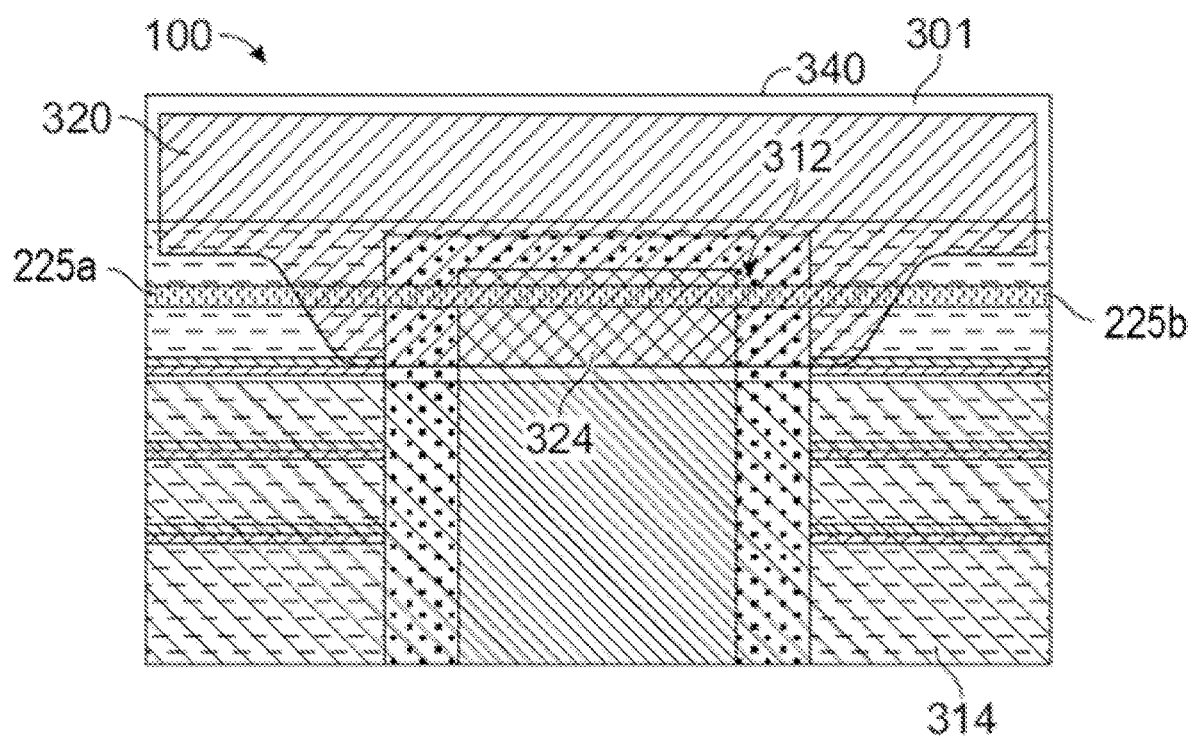

Advantageously, as seen in FIGS. 11D-11E, the T-joint 312 may be covered by the edge seal 320. However, the edge seal 320 does not cover the entire bus member 224 across the length Y of the photovoltaic device 100. Rather, the bus member 224 remains uncovered by the edge seal 320, for some portion 225a, 225b on each side of the T-joint 312.

Referring now to FIG. 11E, the interlayer 314 may be added as previously described. After the interlayer 314 is added, the portions 225a, 225b of the bus member 224 may be uncovered by the interlayer 314, and may therefore be uncovered by both the edge seal 320 and the interlayer 314. Furthermore, areas of the first photovoltaic cell 200a on opposing sides of the T-joint 312 may also be uncovered by the edge seal 320 and uncovered by the interlayer 314. In any event, because the bus member 224 is covered by the edge seal 320 where the bus member 224 overlaps the conductive member 226, the T-joint 312 is more robust and is protected during subsequent manufacturing steps. Advantageously, this embodiment does not require as much material to form the edge seal 320 as the embodiment depicted in FIGS. 10A-10E. This embodiment also allows for a reduced size of the first photovoltaic cell 200*a*, because the interlayer 314 is not used to cover and protect the T-joint 312.

Figure 12A:
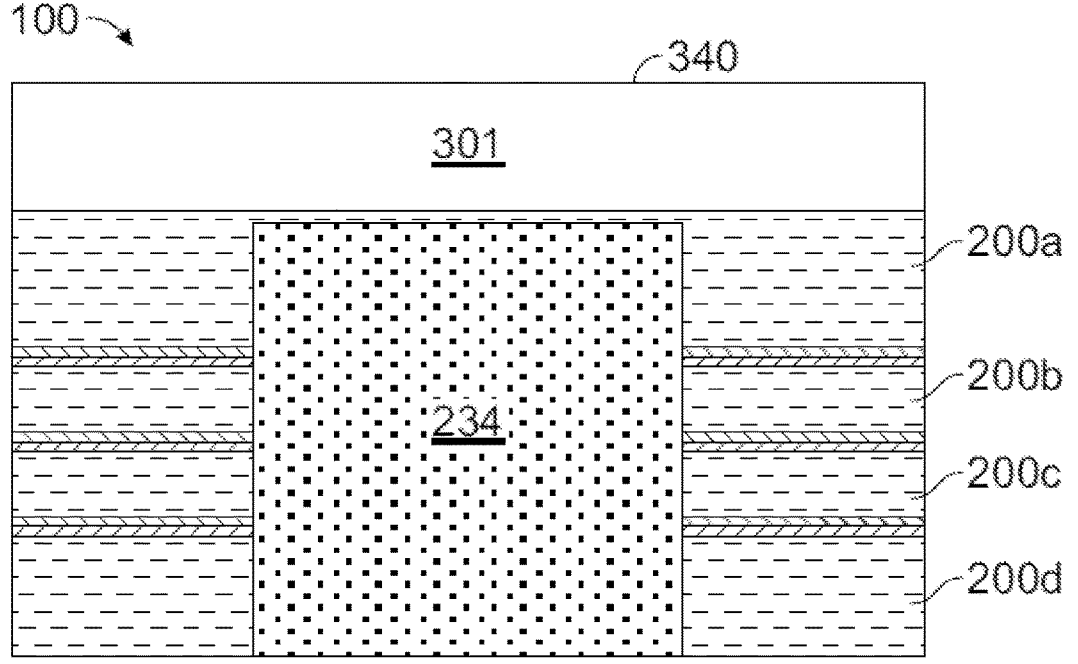
FIGS. 12A-12F schematically depict a photovoltaic device according to one or more embodiments shown and described herein during sequential steps of a manufacturing process.
Figure 12B:
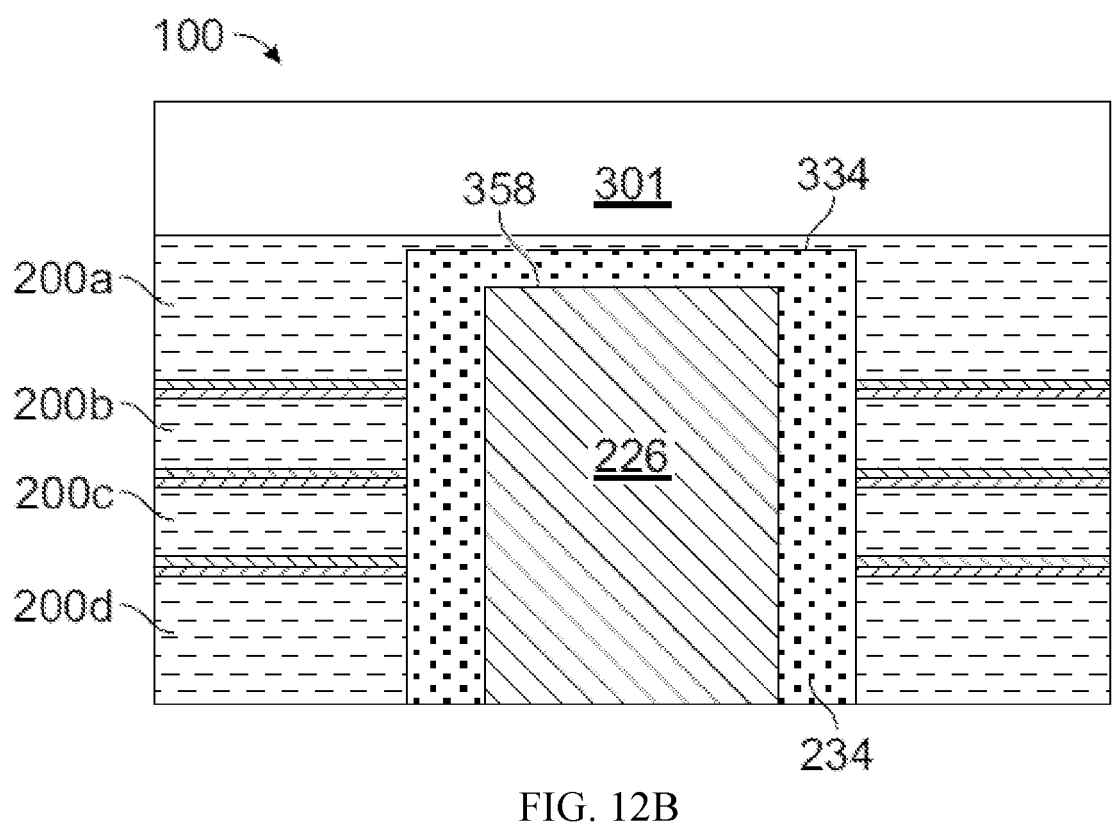

Referring now to FIGS. 12A-12F, an alternative embodiment of a photovoltaic device 100 at certain sequential steps of a manufacturing process is depicted. As shown in FIGS. 12A-12B, the insulating material 234 may be added over the photovoltaic cells 200, and the conductive member 226 may be added over the insulating material 234, as previously described. A dead area 301 may extend inwardly from the peripheral edge 340 of the photovoltaic device 100, formed by a suitable ablation method. The insulating material 234 has a peripheral edge 334 that may be over the first photovoltaic cell 200*a*, and may be near the dead area 301. In other embodiments, the peripheral edge 334 of the insulating material 234 may be on the dead area 301. The conductive member 226 has a peripheral edge 358 that may be on the opposite side of the peripheral edge 334 from the dead area 301, though still over the first photovoltaic cell 200*a*.

Figure 12C:
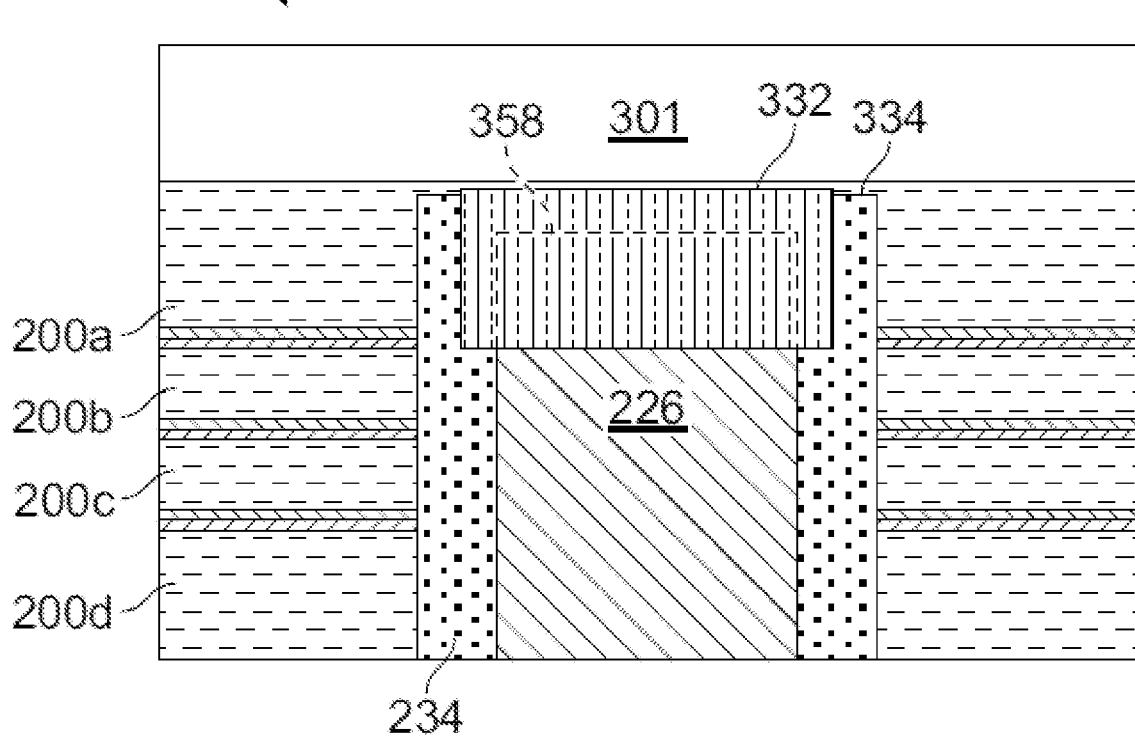

Referring now to FIG. 12C, a bridge 332 may be formed over the insulating material 234 and the conductive member 226. The bridge 332 may cover the peripheral edge 358 of the conductive member 226, and may extend over adjacent portions of the insulating material 234. The bridge 332 may extend over the peripheral edge 334 of the insulating material 234. The bridge 332 can be formed, for example, from a wide conductive metal with conductive adhesive and can serve to bridge the bus member 224 and the conductive member 226. In some embodiments, the bridge 332 is a multilayer structure composed of one or more conductive metal layers and one or more conductive adhesive layers. In some embodiments, the bridge 332 is a multilayer structure composed of a liner, one or more layers of a conductive metal, and one or more layers of a conductive adhesive. In some embodiments, the bridge 332 is a multilayer structure composed of two or more conductive metal layers and two or more conductive adhesive layers.

Figures 12D, 12E:
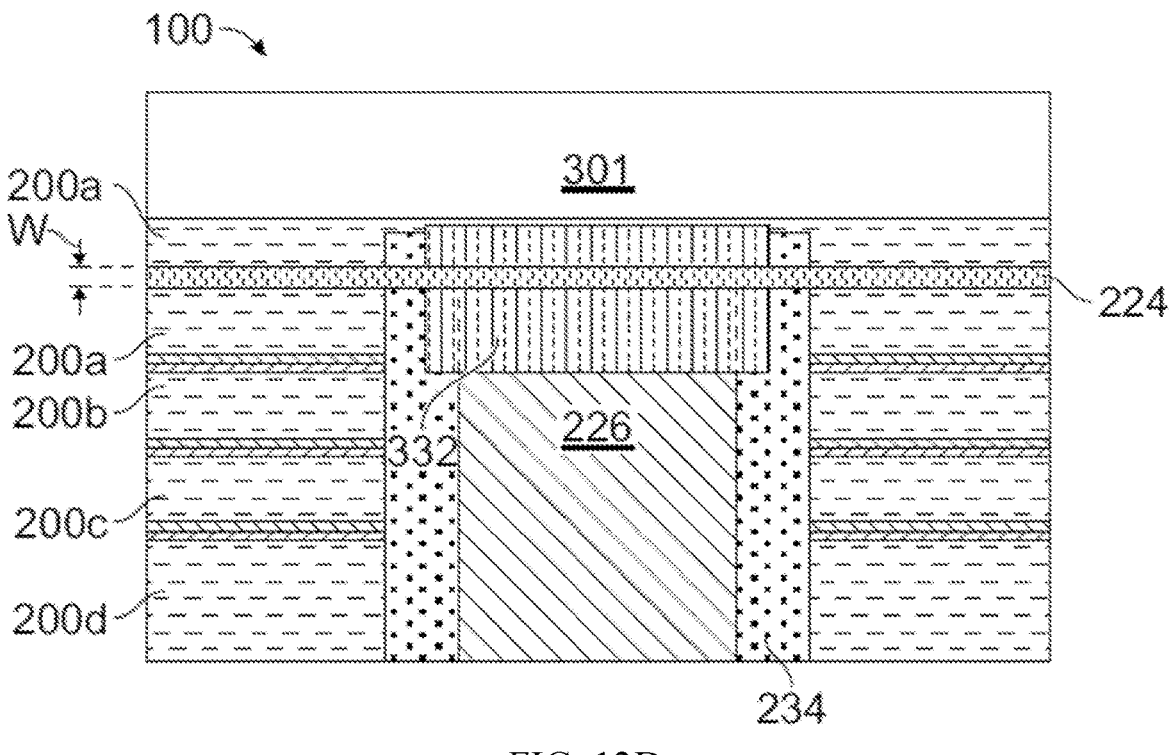

Referring now to FIG. 12D, the bus member 224 may be added over the bridge 332. The bus member 224 may extend along the length Y from a location near a dead area at the first side edge 306 to a location near a dead area at the second side edge 308 of the photovoltaic device 100. The bus member 224 may have a width W that is completely over the first photovoltaic cell 200*a*. The bus member 224 may be electrically coupled to the first photovoltaic cell 200*a*, for example, by directly contacting the first photovoltaic cell 200*a* or through a conductive metal or a conductive adhesive. Additionally, the bus member 224 may be in direct contact with the bridge 332. The bridge 332 may be disposed between the conductive member 226 and the bus member 224. The bridge 332 may be configured to electrically couple the conductive member 226 to the bus member 224. The bridge 332 may serve to enhance the conduction of current between the bus member 224 and the conductive member 226.

Referring now to FIG. 12E, the edge seal 320 may be formed over the bus member 224 and portions of the bridge 332 and insulating material 224. The edge seal 340 may cover the entire bus member 224. The edge seal 320 may extend from a location near a dead area at the first side edge 306 to a location near a dead area at the second side edge 308 of the photovoltaic device 100. The edge seal 320 may leave some of the dead area 301 remaining uncovered at or near the peripheral edge 340 of the photovoltaic device 100. In alternative embodiments, the edge seal 320 may extend to the peripheral edge 340 such that no dead area 301 remains uncovered by the edge seal 320.

Figure 12F:
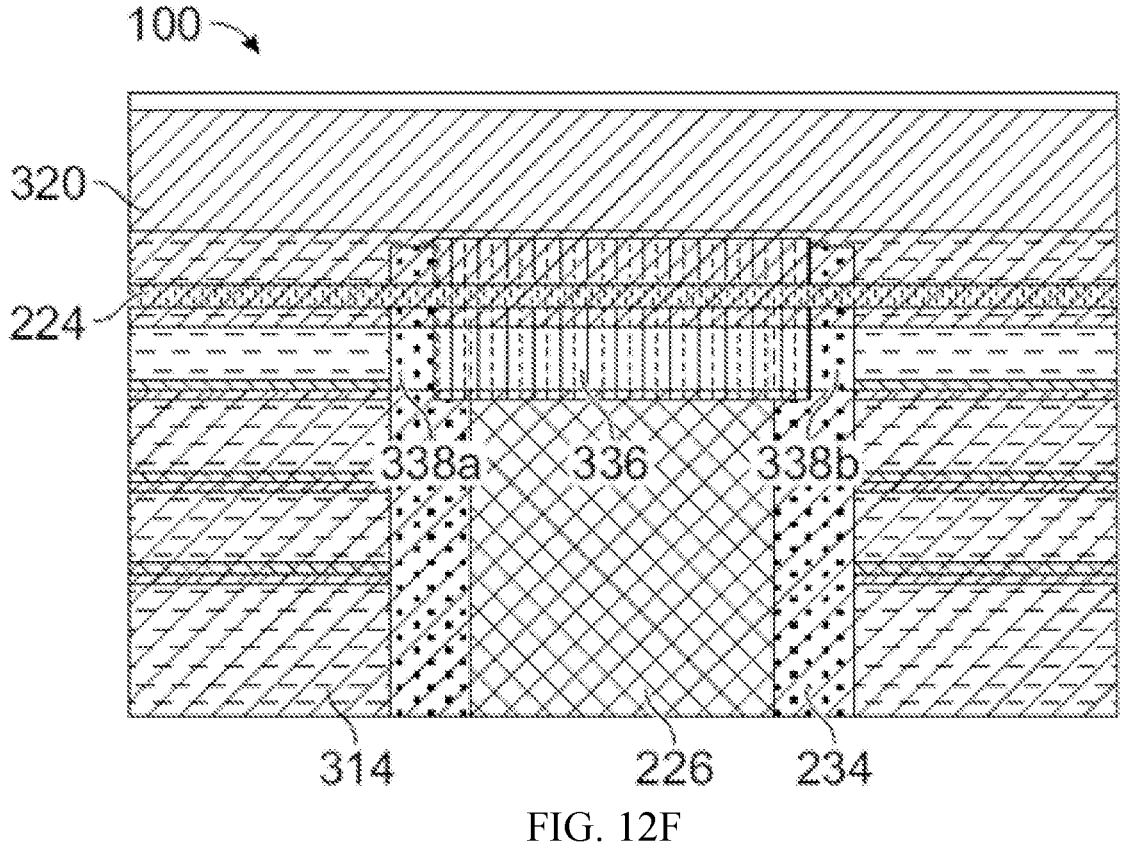

Referring now to FIG. 12F, the interlayer 314 may be formed so as to leave an exposed area 336 of the bridge 332 and exposed areas 338*a*, 338*b* of the insulating material 234, where such areas 336, 338*a*, 338*b* are uncovered by the edge seal 320 and uncovered by the interlayer 314. Further, the conductive member 226 may be partly covered by the bridge 332 and partly covered by the interlayer 314. In this embodiment, the bus member 224 may be completely covered by the edge seal 320, and therefore protected by the edge seal 320 during subsequent manufacturing steps. Thus, advantageously, this embodiment also allows for a reduced size of the first photovoltaic cell 200*a* because the interlayer 314 is not being used to protect the bus member 224.

Figure 13A:
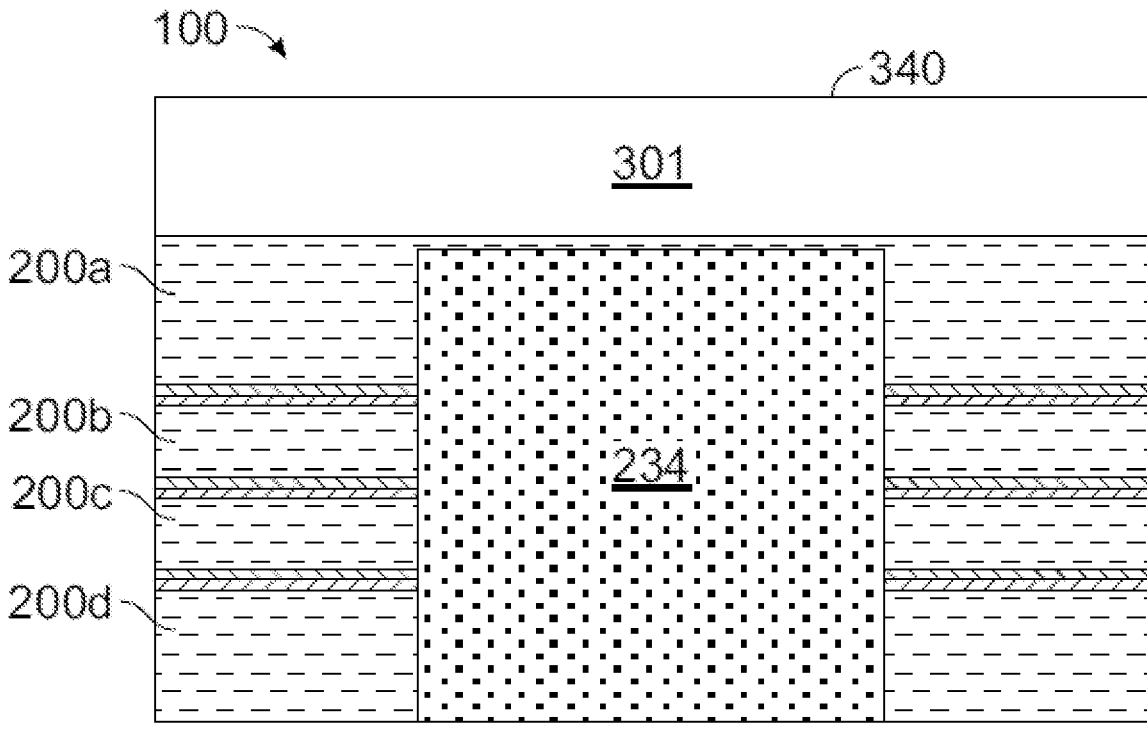
FIGS. 13A-13F schematically depict a photovoltaic device according to one or more embodiments shown and described herein during sequential steps of a manufacturing process.
Figure 13B:
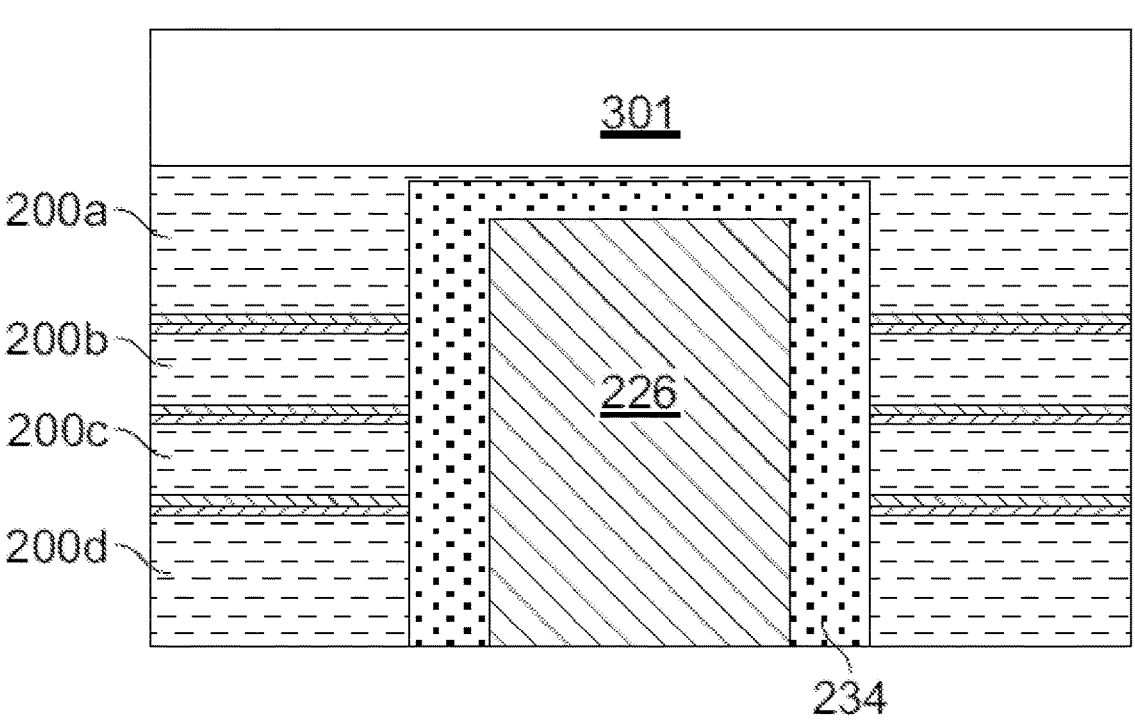

Referring now to FIGS. 13A-13E, an alternative embodiment is depicted in which the bridge 332 is formed over the bus member 224 instead of between the bus member 224 and the conductive member 226. As seen in FIGS. 13A-13B, the insulating material 234 and then the conductive member 226 may be applied over the photovoltaic cells 200 as previously described. The insulating material 234 may extend over at least a portion of the first photovoltaic cell 200*a*. A dead area 301 may be formed extending inwardly from the peripheral edge 340 of the photovoltaic device 100 by a suitable ablation method.

Figure 13C:
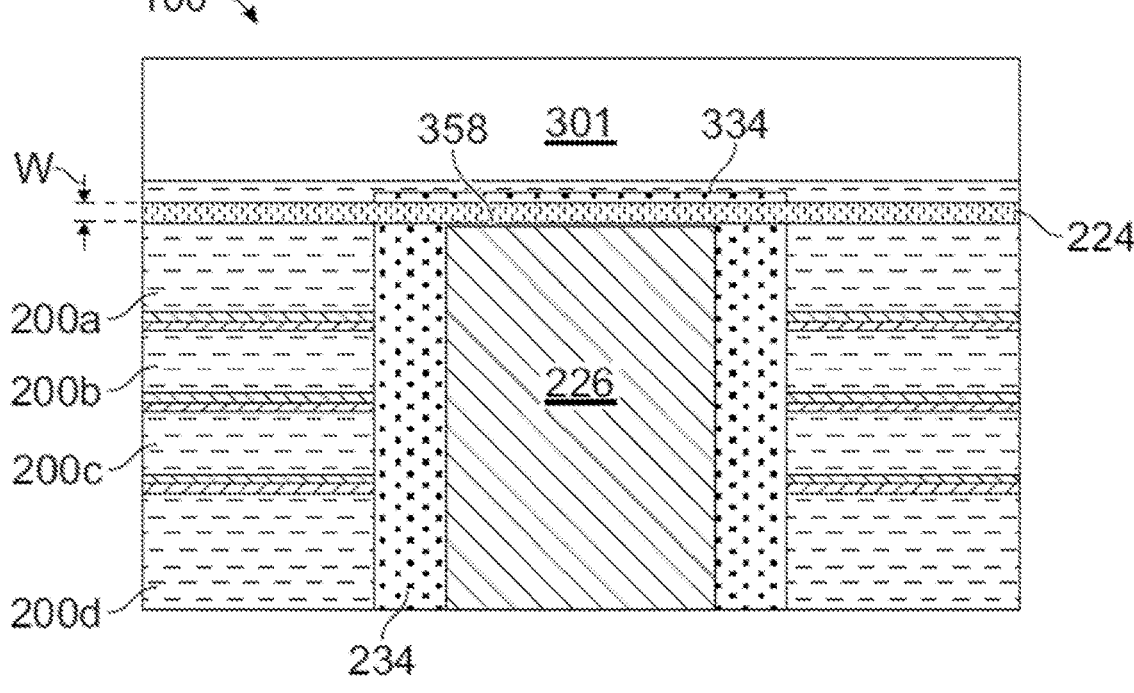

Referring now to FIG. 13C, the bus member 224 may be applied as before, extending along the length Y over the conductive member 226 and over the first photovoltaic cell 200*a* from a location near a dead area at the first side edge 306 to a location near a dead area at the second side edge 308 of the photovoltaic device 100. The bus member 224 may have a width W that is completely on top of the first photovoltaic cell 200*a*. The bus member 224 may be electrically coupled to the first photovoltaic cell 200*a*, for example by direct contact or via a conductive metal or a conductive adhesive. However, in this embodiment, in contrast to the embodiment depicted in FIGS. 12A-12F, the bus member 224 is applied before the bridge 332.

Figures 13D, 13E:
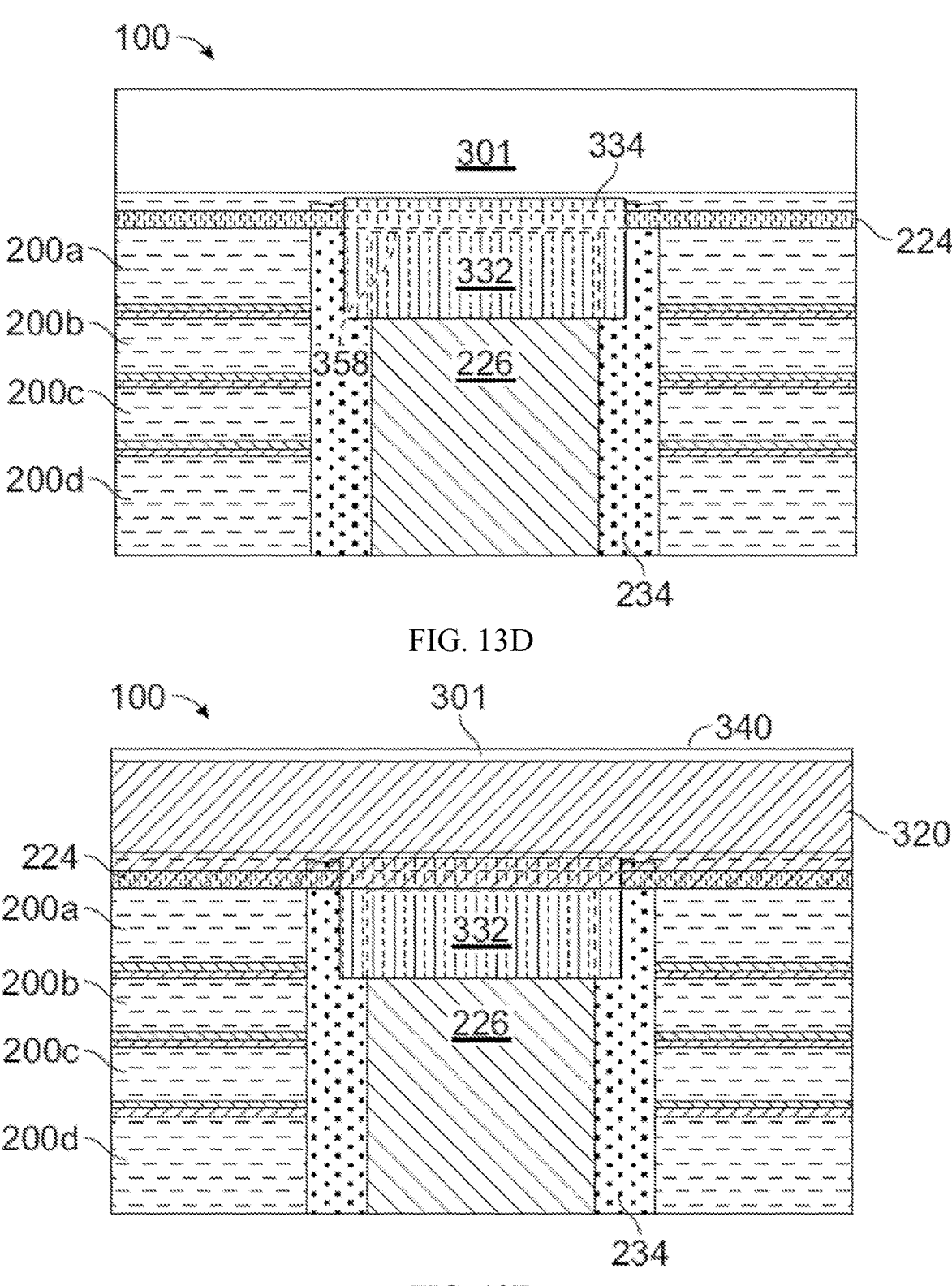

Referring now to FIG. 13D, the bridge 332 may be applied over the bus member 224, and can be rolled into place at the peripheral edge 358 of the conductive member 226 and the peripheral edge 334 of the insulating material 234. As in the previous embodiment, the bridge 332 can be formed from a wide conductive metal with a conductive adhesive, and can serve to bridge the bus member 224 and the conductive member 226. In some embodiments, the bridge 332 is a multilayer structure composed of one or more conductive metal layers and one or more conductive adhesive layers. In some embodiments, the bridge 332 is a multilayer structure composed of a liner, one or more layers of a conductive metal, and one or more layers of a conductive adhesive. In some embodiments, the bridge 332 is a multilayer structure composed of two or more conductive metal layers and two or more conductive adhesive layers. In contrast to the previous embodiment, however, the bridge 332 may be disposed on top of the bus member 224 and the conductive member 226 such that a portion of the bus member 224 is disposed between the insulating material 234 and the bridge 332, and a portion of the conductive member 226 is disposed between the insulating material 234 and the bridge 332. The bus member 224 may not be in direct contact with the conductive member 226, but is electrically coupled to the conductive member 226 through the bridge 332. In this embodiment, the bus member 224 is conductive on both sides to facilitate electrical communication. That is, the bus member 224 may include a first surface facing the first photovoltaic cell 200a comprising a conductive material, and a second surface facing the bridge 332 comprising a conductive material.

Figure 13F:
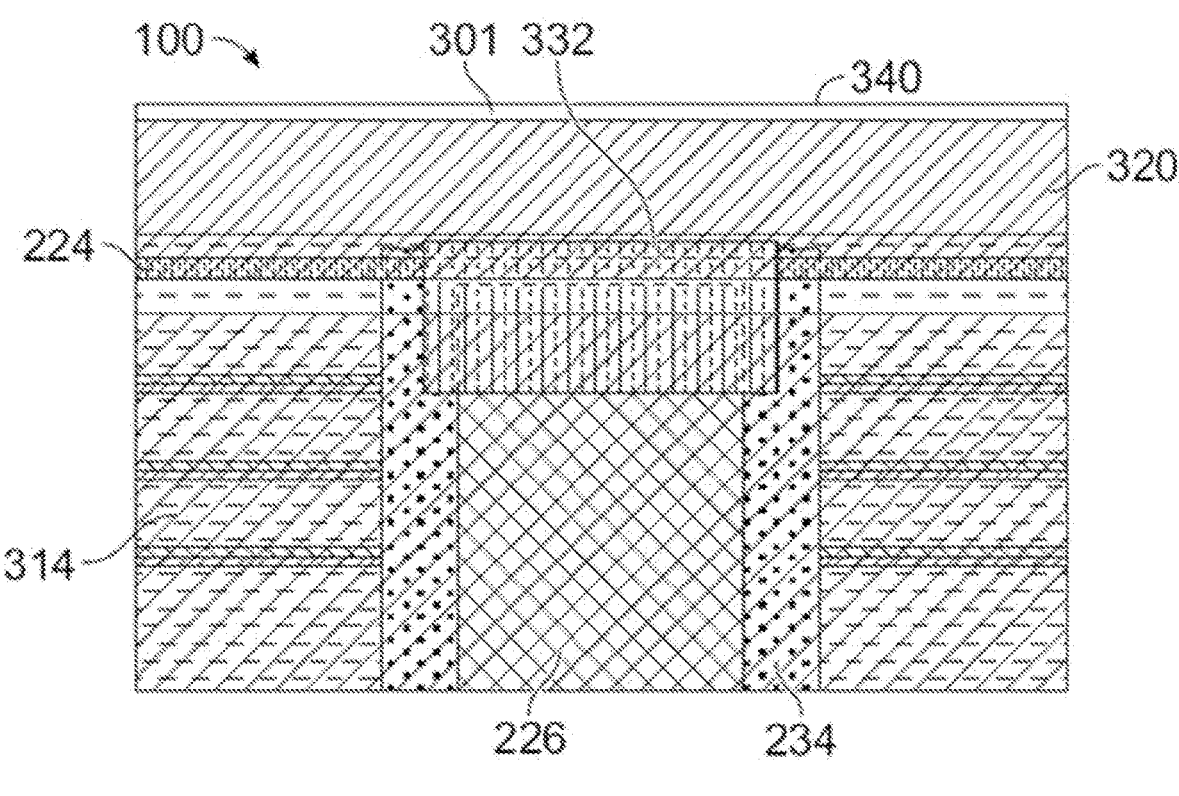

Referring now to FIGS. 13E-13F, application of the edge seal 320 and the interlayer 314, can be the same as previously described. The edge seal 320 may extend along the length Y from a location near a dead area at the first side edge 306 to a location near a dead area at the second side edge 308, leaving uncovered some of the dead area 301 adjacent the peripheral edge 340 of the photovoltaic device 100. Alternatively, the edge seal 320 may extend to the peripheral edge 340 such that none of the dead area 301 remains uncovered by the edge seal 320. The edge seal 320 may extend along the width X so as to cover the exposed portions of the bus member 224 not covered by the bridge 332. Thus, in this embodiment, the bridge 332 and the edge seal 320 may protect the bus member 224 during subsequent manufacturing steps.

The interlayer 314 may extend along the length Y from a location near a dead area at the first side edge 306 to a location near a dead area at the second side edge 308 of the photovoltaic device 100. The interlayer 314 may cover portions of the bridge 332, conductive member 226, and insulating material 234 not covered by the edge seal 320. Thus, in this embodiment, the bus member 224 is again completely covered by the edge seal 320, and therefore protected by the edge seal 320 during subsequent manufacturing steps. Therefore, this embodiment advantageously allows for a reduction in the size of the first photovoltaic cell 200a, because the interlayer 314 is not being used to cover and protect the bus member 224.

Figure 14A:
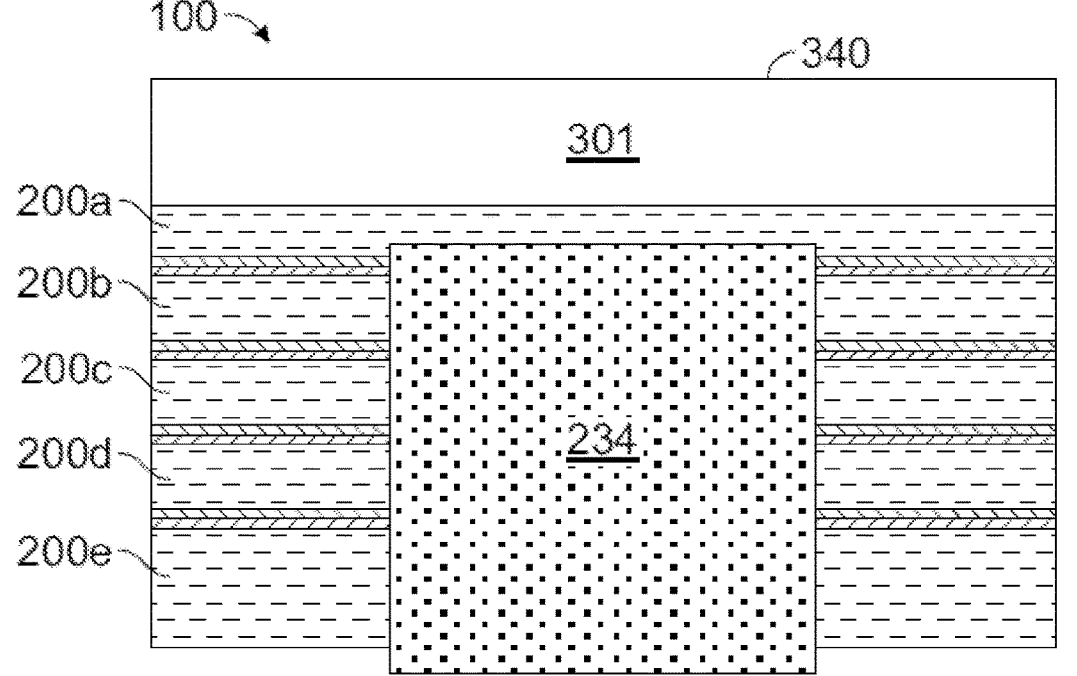
FIGS. 14A-14E schematically depict a photovoltaic device according to one or more embodiments shown and described herein during sequential steps of a manufacturing process.
Figure 14B:
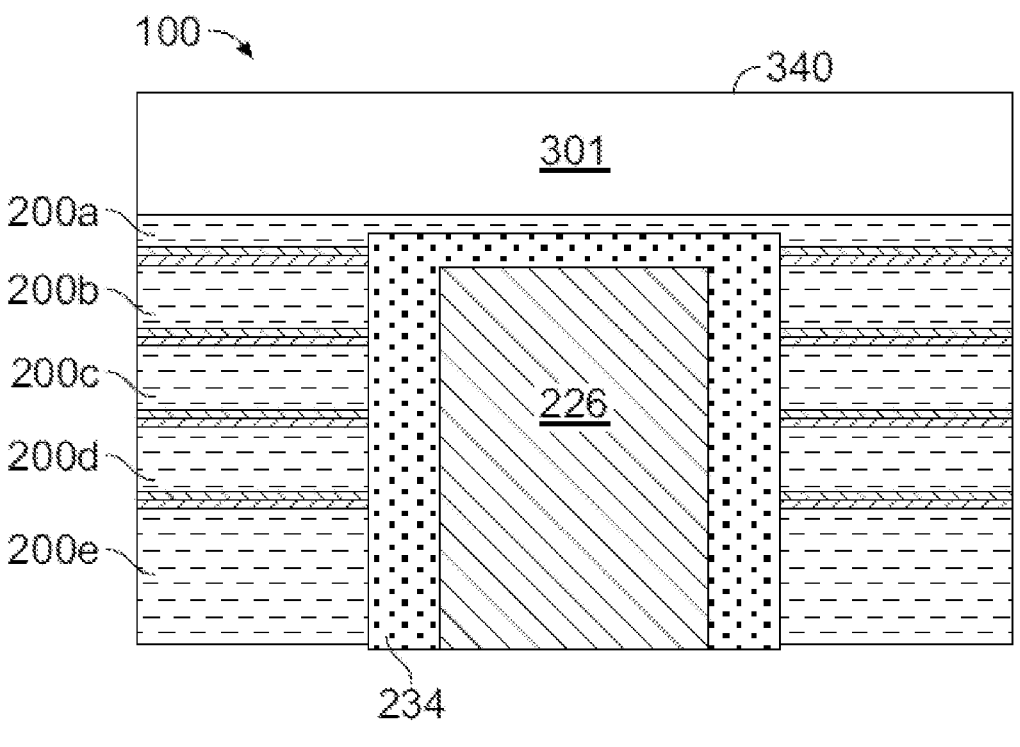

Referring now to FIGS. 14A-14E, an alternative embodiment of a photovoltaic device 100 at certain sequential stages of a manufacturing process is depicted. As shown in FIGS. 14A-14B, the insulating material 234 and then the conductive member 226 may be added over the photovoltaic cells 200 as previously described. The insulating material 234 and the conductive member 226 may extend over at least a portion of the first photovoltaic cell 200a. A dead area 301 may be formed by a suitable ablation method adjacent to the peripheral edge 340 of the photovoltaic device 100.

Figure 14C:
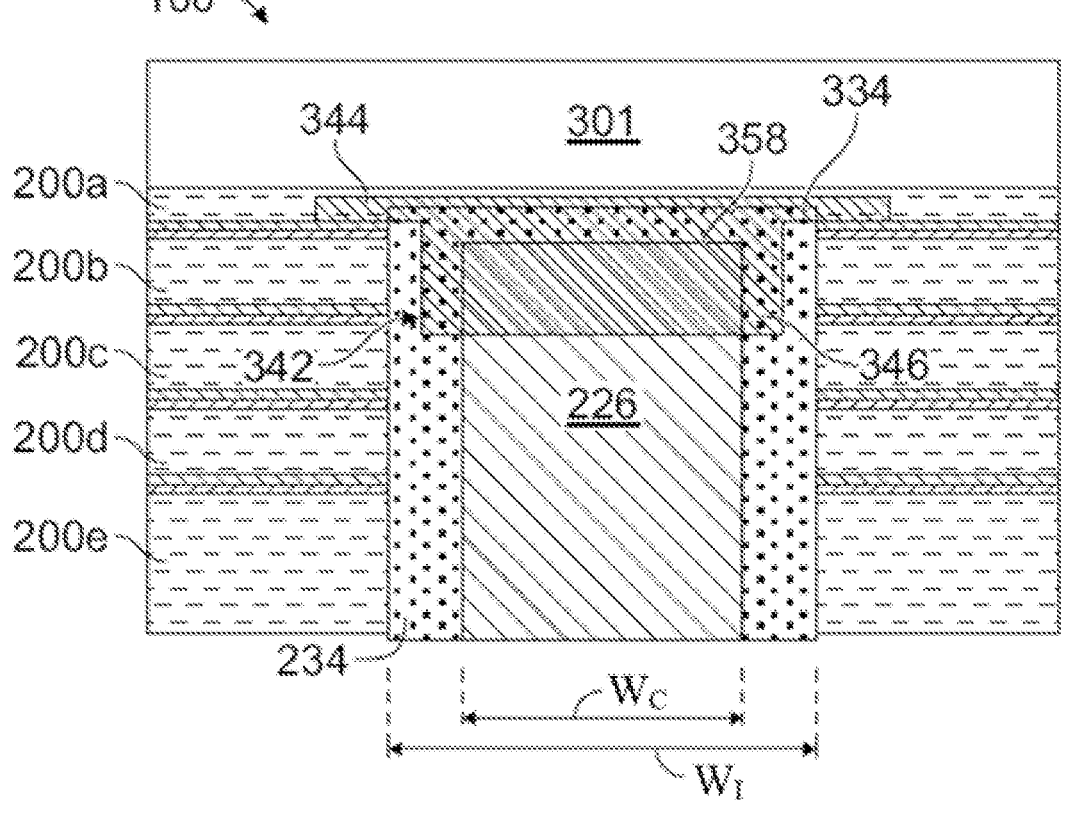

Referring now to FIG. 14C, a patch 342 may be added over the insulating material 234 and the conductive member 226. The patch 342 may be composed of a conductive material, and may be printed onto the photovoltaic device 100. However, the patch 342 does not need to be a printed conductor. The patch 342 may serve to enhance conduction of the electricity generated from the photovoltaic cells 200 to the bus member 224.

Referring still to FIG. 14C, the patch 342 may include a top portion 344 and a bottom portion 346. The bottom portion 346 may be wide enough to cover the width $W_C$ of the conductive member 226 but not wide enough to cover the entire width $W_1$ of the insulating material 234, and the top portion 344 may be wide enough to extend across the first photovoltaic cell 200a for a distance greater than the entire width $W_1$ of the insulating material 234. The top portion 344 may not cover the insulating material 234 or the conductive member 226. The bottom portion 346 may cover a segment of the conductive member 226 for the entire width $W_C$ of the conductive member 226, as well as surrounding areas of the insulating material 234. The patch 342 may cover the peripheral edge 334 of the insulating material 234 and the peripheral edge 358 of the conductive member 226, and the top portion 344 may extend beyond the peripheral edge 334 of the insulating material 234 toward the dead area 301, as well as toward the first side edge 306 of the photovoltaic device 100 and/or the second side edge 308 of the photovoltaic device 100.

Figure 14D:
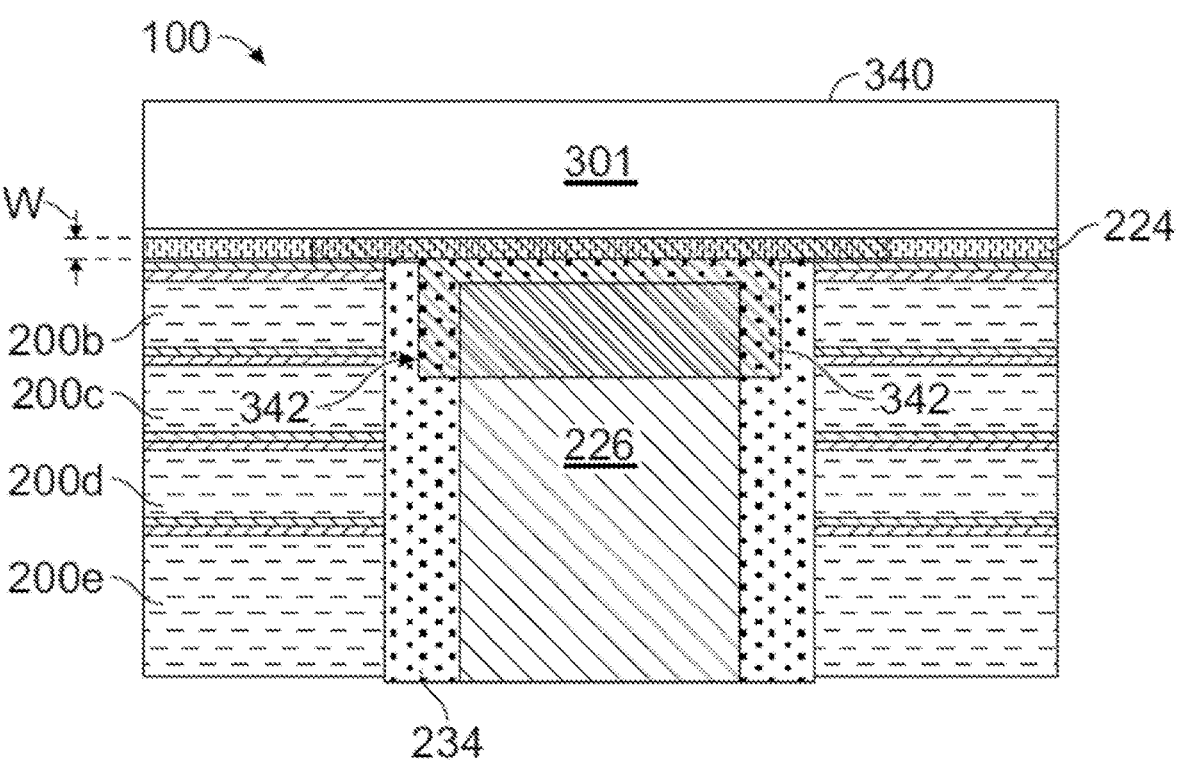

Referring now to FIG. 14D, the bus member 224 may be added across the top portion 344 of the patch 342, extending along the length Y from a location near a dead area at the first side edge 306 to a location near a dead area at the second side edge 308 of the photovoltaic device 100. The bus member 224 may have a width W that is completely over the first photovoltaic cell 200a. The bus member 224 may be electrically coupled to the first photovoltaic cell 200a, for example by direct contact or through a conductive metal or a conductive adhesive. The bus member 224 may be electrically coupled to the conductive member 226 through the patch 342.

Figure 14E:
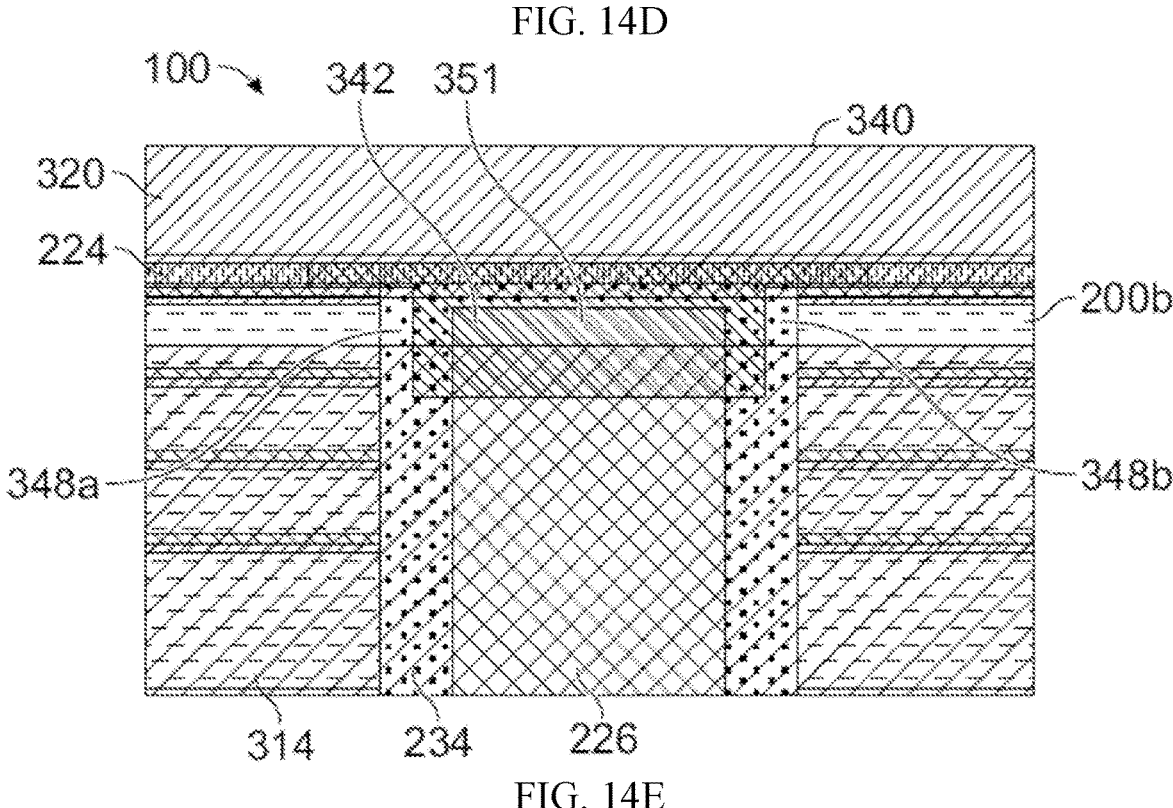

Referring now to FIG. 14E, the edge seal 320 and the interlayer 314 may be added as previously described, extending along the length Y from a location near a dead area at the first side edge 306 to a location near a dead area at the second side edge 308 of the photovoltaic device 100. The edge seal 320 may completely cover the bus member 224, and therefore protect the bus member 224 during subsequent manufacturing steps. Areas 348a, 348b of the insulating material 234 on respective sides of the patch 342, and an area 351 of the patch 342, may remain uncovered by the edge seal 320 and uncovered by the interlayer 314. However, the bus member 224 may be completely covered by the edge seal 320. Therefore, this embodiment also allows for a reduction in the size of the first photovoltaic cell 200a, because the interlayer 314 is not being used to cover and protect the bus member 224 during subsequent manufacturing steps. Furthermore, the patch 342 may enhance the electrical conduction from the photovoltaic cells 200 through the bus member 224 to the conductive member 226 while also providing robustness to the bus member 224.

Advantageously, the photovoltaic devices 100 described herein may have bussing configurations that reduce dead area loss from end cells to nearly zero, thereby improving device efficiency. Furthermore, the photovoltaic devices 100 described herein may have bussing configurations that provide for low and stable contact resistance at the T-joint 312, which is important for good device performance.

The bussing components described herein, such as the insulating material 234, conductive member 226, bridge 332, patch 342, edge seal 320, and interlayer 314, may each be deposited by any suitable method, and may be sequentially added in a conveyored system using one or more stations or chambers. Some components, such as the patch 342, may be printed onto the photovoltaic device 100. However, the patch 342 need not be printed, and may be applied through other methods.

According to embodiments described herein, a photovoltaic device may include a bus member that is fully covered under an edge seal. The edge seal may protect the bus member during certain manufacturing steps. According to embodiments described herein, a photovoltaic device may include a bus member overlapping a conductive member to define a T-joint, where the T-joint is fully covered under an edge seal. However, in some embodiments, at least a portion of the bus member is not covered by the edge seal, while the portion of the bus member overlapping the conductive member (i.e., the T-joint) is covered by the edge seal. For example, in some embodiments, two portions of the bus member, on opposing sides of the T-joint, are not covered by the edge seal. By "covered" it is meant that the bus member, or a portion thereof, is disposed between the edge seal and the photovoltaic cells.

According to embodiments described herein, a photovoltaic device may include a patch of a conductive material that overcomes tolerance and improves robustness of a T-joint defined by the overlap of a bus member over a conductive member.

According to embodiments described herein, a photovoltaic device may include a bridge composed of a conductive metal and a conductive adhesive that electrically couples a bus member to a conductive member. According to embodiments described herein, the bridge may be a multilayer structure composed of two or more layers of the conductive metal and two or more layers of the conductive adhesive. According to embodiments described herein, the bridge may be a multilayer structure composed of one or more conductive metal layers and one or more conductive adhesive layers. According to embodiments described herein, the bridge may be a multilayer structure composed of a liner, one or more layers of a conductive metal, and one or more layers of a conductive adhesive.

According to embodiments described herein, a photovoltaic device having a bus member that is disposed between an edge seal and a plurality of photovoltaic cells may further include a bridge comprising a conductive adhesive that electrically couples the bus member to a conductive member. In certain embodiments, the bridge is disposed between an insulating material and the bus member. In certain embodiments, the bridge is disposed between the bus member and the edge seal.

According to embodiments described herein, a photovoltaic device having a bus member that is disposed between an edge seal and a plurality of photovoltaic cells may further include a conductive patch disposed between a conductive member and the bus member.

According to embodiments described herein, a photovoltaic device having a bridge or a patch as described herein may also have a bus member that is not fully covered by an edge seal. Rather, the bus member may include one or more portions that are not disposed between the edge seal and the photovoltaic cells.

According to embodiments described herein, a photovoltaic device having a bridge or a patch as described herein may also have an edge seal with a first length and a second length, where the first length and the second length are different, and side portions connecting edge seal material of the first length and edge seal material of the second length.

According to embodiments described herein, a photovoltaic device having a bridge or a patch as described herein may also include an edge seal that is disposed over a T-joint defined by the overlap of a bus member over a conductive member, and is not disposed over at least a portion of the bus member. In alternative embodiments, the edge seal is disposed over the entire bus member.

According to embodiments described herein, a photovoltaic device may have a bus member composed of a multilayer structure comprising a liner, a metal, and a conductive adhesive. Such a bus member may be employed in a photovoltaic device having a patch or a bridge as described herein. Such a bus member may also be employed in a photovoltaic device having an edge seal that covers some or all of the bus member.

According to embodiments described herein, a photovoltaic device may include an edge seal having a first length over a dead area, and a second length over a T-joint defined by the overlap of a bus member over a conductive member, where the first length is greater than the second length. In some embodiments, the bus member of such a photovoltaic device comprises two portions that are uncovered by the edge seal. In some embodiments, the photovoltaic device further comprises a bridge as described herein. In some embodiments, the photovoltaic device further comprises a patch as described herein.

Certain embodiments of the devices and methods disclosed herein are defined in the above examples. It should be understood that these examples, while indicating particular embodiments, are given by way of illustration only. From the above discussion and these examples, one skilled in the art can ascertain the essential characteristics of this disclosure, and without departing from the spirit and scope thereof, can make various changes and modifications to adapt the devices and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A photovoltaic device comprising:
   a plurality of electrically connected photovoltaic cells, wherein the photovoltaic cells of the plurality of photovoltaic cells comprise a conducting layer having a first surface and a second surface, the first surface facing an absorber layer;
   an insulating material disposed on the second surface over one of the photovoltaic cells;
   a conductive member on the insulating material, wherein the insulating material is configured to electrically insulate the conductive member from the second surface;
   a bus member electrically coupled to the one of the plurality of photovoltaic cells and to the conductive member; and
   an edge seal comprising a sealant material extending over at least a portion of the one of the plurality of photovoltaic cells;
   wherein the bus member is disposed between the edge seal and the plurality of photovoltaic cells, and wherein the bus member overlaps the conductive member to define a T-joint, the T-joint is disposed between the edge seal and the plurality of photovoltaic cells, and at least a portion of the bus member is not between the edge seal and the plurality of photovoltaic cells.

2. The photovoltaic device of claim 1, wherein two portions of the bus member are not between the edge seal and the plurality of photovoltaic cells.

3. The photovoltaic device of claim 1, further comprising an interlayer disposed on at least some of the plurality of photovoltaic cells.

4. The photovoltaic device of claim 1, wherein the bus member is between the edge seal and the conductive member.

5. The photovoltaic device of claim 4, wherein the conductive member is between the bus member and the insulating material.

6. The photovoltaic device of claim 1, further comprising a bridge formed over the conductive member and the insulating material, wherein the bridges comprises a conductive adhesive and electrically couples the conductive member to the bus member.

7. The photovoltaic device of claim 6, wherein a first portion of the bridge is disposed under the edge seal, a second portion of the bridge is uncovered by the edge seal and uncovered by an interlayer, and a third portion of the bridge is disposed under the interlayer.

8. The photovoltaic device of claim 6, wherein the bridge comprises a multilayer structure comprising a liner, one or more layers of a conductive metal, and one or more layers of the conductive adhesive.

9. The photovoltaic device of claim 6, wherein the bridge comprises a multilayer structure comprising two or more layers of a conductive metal and two or more layers of the conductive adhesive.

10. The photovoltaic device of claim 6, wherein the bridge comprises a multilayer structure comprising one or more conductive metal layers and one or more conductive adhesive layers.

* * * * *